(12) United States Patent
Lee

(10) Patent No.: US 10,447,951 B1
(45) Date of Patent: Oct. 15, 2019

(54) DYNAMIC RANGE ESTIMATION WITH FAST AND SLOW SENSOR PIXELS

(71) Applicant: QUALCOMM Incorporated, San Diego, CA (US)

(72) Inventor: Jisoo Lee, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/950,945

(22) Filed: Apr. 11, 2018

(51) Int. Cl.
*H04N 5/355* (2011.01)
*H01L 27/146* (2006.01)
*H04N 5/225* (2006.01)
*H04N 5/232* (2006.01)

(52) U.S. Cl.
CPC ... *H04N 5/35581* (2013.01); *H01L 27/14609* (2013.01); *H01L 27/14625* (2013.01); *H01L 27/14654* (2013.01); *H04N 5/2254* (2013.01); *H04N 5/23212* (2013.01)

(58) Field of Classification Search
CPC ........... H04N 5/35563; H04N 5/35581; H04N 5/2254; H04N 5/23212; H01L 27/14609; H01L 27/14625; H01L 27/14654
See application file for complete search history.

(56) References Cited

U.S. PATENT DOCUMENTS

| | | | |
|---|---|---|---|
| 9,392,160 B2 | 7/2016 | Sfaradi et al. | |
| 9,438,815 B2 | 9/2016 | Oda et al. | |
| 9,485,408 B2 | 11/2016 | Inoue et al. | |
| 9,525,813 B2 | 12/2016 | Sakaguchi et al. | |
| 2015/0244916 A1* | 8/2015 | Kang | H04N 5/2353 348/222.1 |
| 2016/0316153 A1 | 10/2016 | Grauer | |

\* cited by examiner

*Primary Examiner* — Nicholas G Giles
(74) *Attorney, Agent, or Firm* — Duane Morris LLP

(57) ABSTRACT

A scene can be captured by integrating a first sensor pixel for a first amount of time to produce an original first photometric and integrating a second sensor pixel for the first amount of time to produce an original second photometric. The first sensor pixel can be configured to saturate with photocharge slower than the second sensor pixel. The scene can be recaptured by integrating the second sensor pixel for a second amount of time less than the first amount of time.

20 Claims, 14 Drawing Sheets

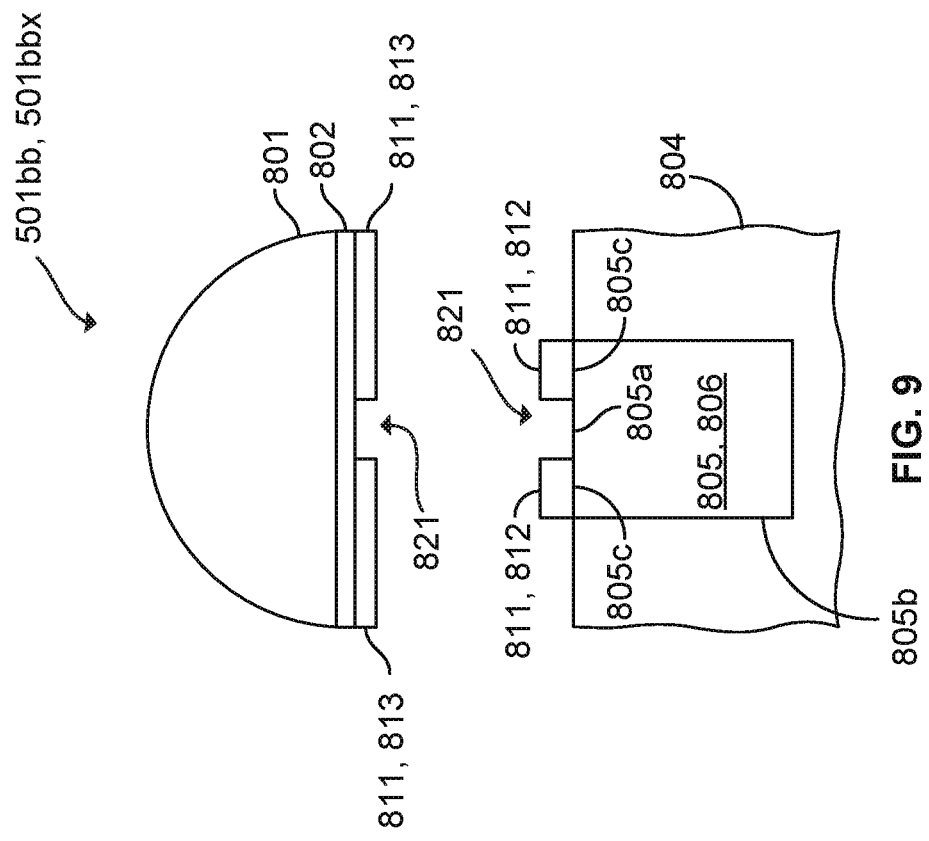
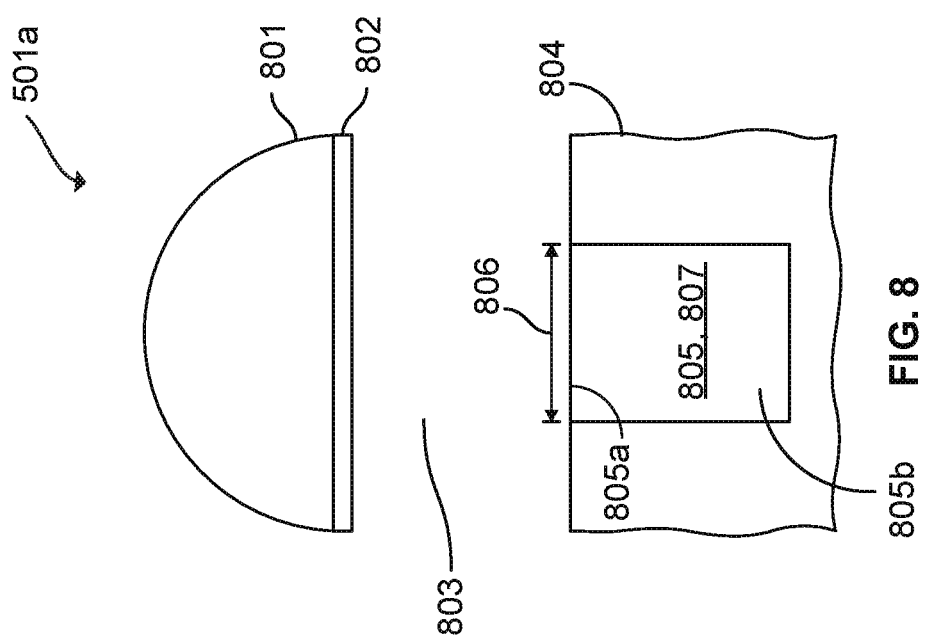

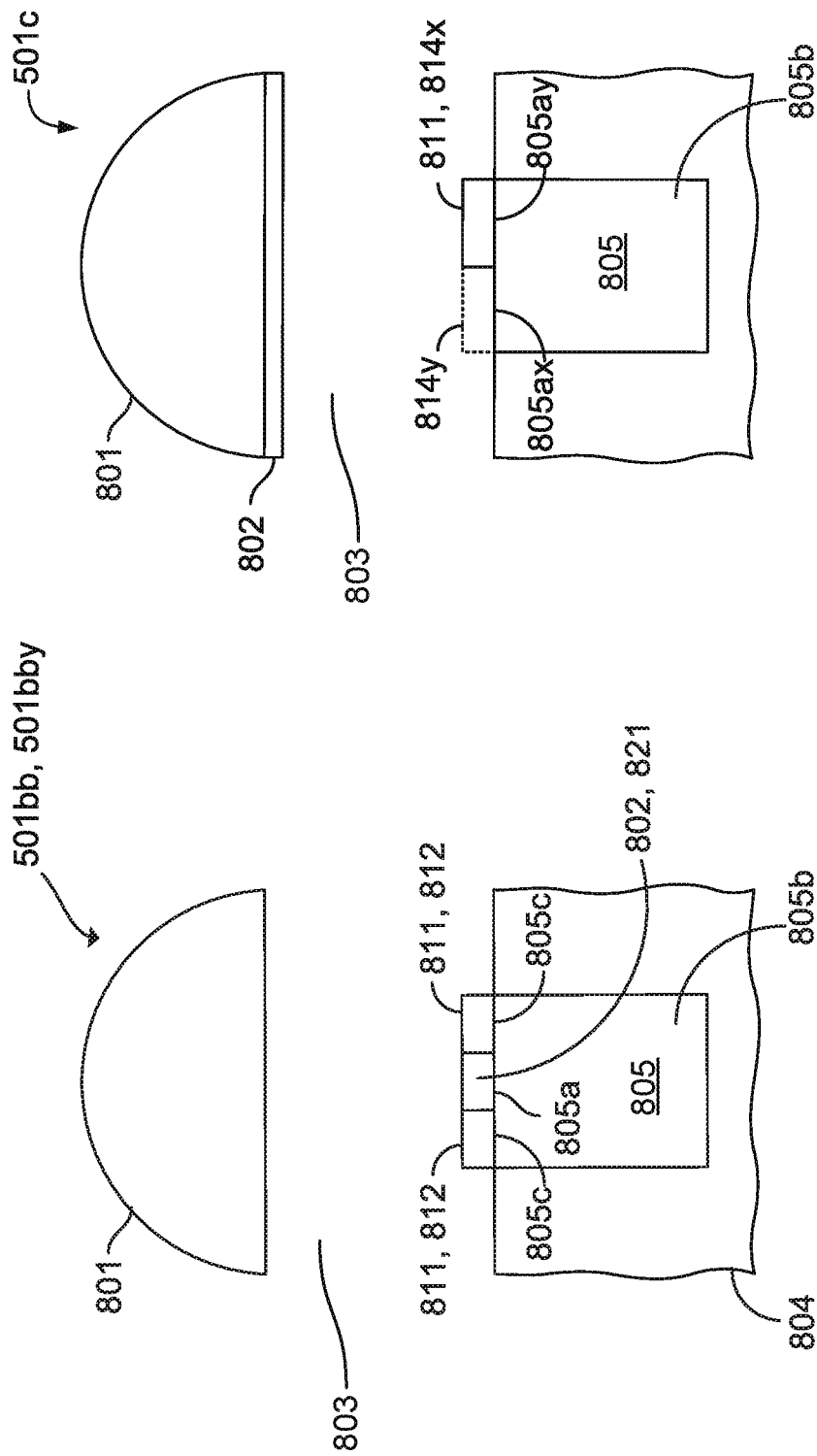

DYNAMIC RANGE ESTIMATION WITH FAST AND SLOW SENSOR PIXELS

BACKGROUND

Field of the Disclosure

The present application relates to digital imaging.

Description of Related Art

Scene dynamic range can describe the range of light intensities in a scene. A scene including the sun and dark shadows will have a wide dynamic range. A scene of a dark, foggy day will have a narrow dynamic range. Similarly, a scene of a bright sky will have a narrow dynamic range.

Light intensity and therefore, dynamic range, can be expressed in terms of unfiltered light or filtered light. A color filter can admit desired light while blocking undesired light. For example, a green filter admits light falling in the green spectrum while blocking light falling outside the green spectrum. As a result, green scene dynamic range can be found by passing scene light through a green color filter.

Digital cameras often include automatic exposure control. During automatic exposure control, a digital camera can measure (e.g., approximate) scene dynamic range, then adjust exposure to match the scene dynamic range. Without automatic exposure control, a digital camera can produce an underexposed image or an overexposed image.

For an underexposed image, some of the digital camera's sensor pixels will receive an underdose of light, causing the sensor pixels to record erroneously small channel values (i.e., undersaturate). For example, a first group of sensor pixels may capture ocean and a second group of sensor pixels may capture beach. During underexposure, both the first and second groups can fail to activate (e.g., capture photometrics of zero). The resulting image would not distinguish between ocean and beach.

For an overexposed image, some of the digital camera's sensor pixels will receive an overdose of light, causing the sensor pixels to record erroneously large channel values (i.e., oversaturate). For example, a first group of sensor pixels may capture sun and a second group of sensor pixels may capture bright sky. During overexposure, both the first and second groups can fully activate (e.g., deliver maximum photometrics). The resulting image would not properly distinguish between sky and sun.

SUMMARY

A method can include capturing a scene by integrating a first sensor pixel for a first amount of time to produce an original first photometric and integrating a second sensor pixel for the first amount of time to produce an original second photometric. The first sensor pixel can be configured to saturate with photocharge slower than the second sensor pixel.

The method can include re-capturing the scene by integrating the second sensor pixel for a second amount of time to produce a newer second photometric. The second amount of time can be based on the original first photometric. The second amount of time can be less than the first amount of time.

A processing system can include one or more processors configured to perform the method. The method can be stored as program code in a non-transitory computer-readable medium. When executed, the code can cause one or more processors to perform the method.

A method can include capturing a scene with a scene dynamic range by integrating a plurality of first sensor pixels for a first amount of time to produce a plurality of original first photometrics and integrating a plurality of second sensor pixels for the first amount of time to produce a plurality of original second photometrics. Each of the plurality of first sensor pixels can be configured to saturate with photocharge slower than each of the plurality of second sensor pixels.

The method can include normalizing the plurality of original first photometrics with respect to the plurality of second sensor pixels. The method can include determining whether at least some of the plurality of second sensor pixels clipped a top end of the scene dynamic range based on the normalized plurality of original first photometrics.

The method can include re-capturing the scene by integrating the plurality of second sensor pixels for a second amount of time to produce a plurality of newer second photometrics based on determining that at least some of the plurality of second sensor pixels clipped the top end of the scene dynamic range. The second amount of time can be less than the first amount of time.

A processing system can include one or more processors configured to perform the method. The method can be stored as program code in a non-transitory computer-readable medium. When executed, the code can cause one or more processors to perform the method.

A non-transitory computer-readable medium can include program code, which, when executed by one or more processors, causes the one or more processors to perform operations. The program code can include code for: capturing a scene by integrating a first sensor pixel for a first amount of time to produce an original first photometric and integrating a second sensor pixel for the first amount of time to produce an original second photometric. The first sensor pixel can be configured to saturate with photocharge slower than the second sensor pixel.

The program code can include code for: re-capturing the scene by integrating the second sensor pixel for a second amount of time to produce a newer second photometric. The second amount of time can be based on the original first photometric. The second amount of time can be less than the first amount of time.

A processing system can include means for capturing a scene by integrating a first sensor pixel for a first amount of time to produce an original first photometric and integrating a second sensor pixel for the first amount of time to produce an original second photometric. The processing system can include means for re-capturing the scene by integrating the second sensor pixel for a second amount of time to produce a newer second photometric. The second amount of time can be based on the original first photometric. The second amount of time can be less than the first amount of time.

BRIEF DESCRIPTION OF DRAWINGS

The above summary and the below detailed description of illustrative embodiments may be better understood when read in conjunction with the appended Figures. The Figures show some of the illustrative embodiments discussed herein. For clarity and ease of reading, some Figures omit views of certain features. Unless expressly stated otherwise, the Figures are not to scale and features are shown schematically.

FIGS. 8-14 show example sensor pixel configurations.

DETAILED DESCRIPTION

Figure 1:
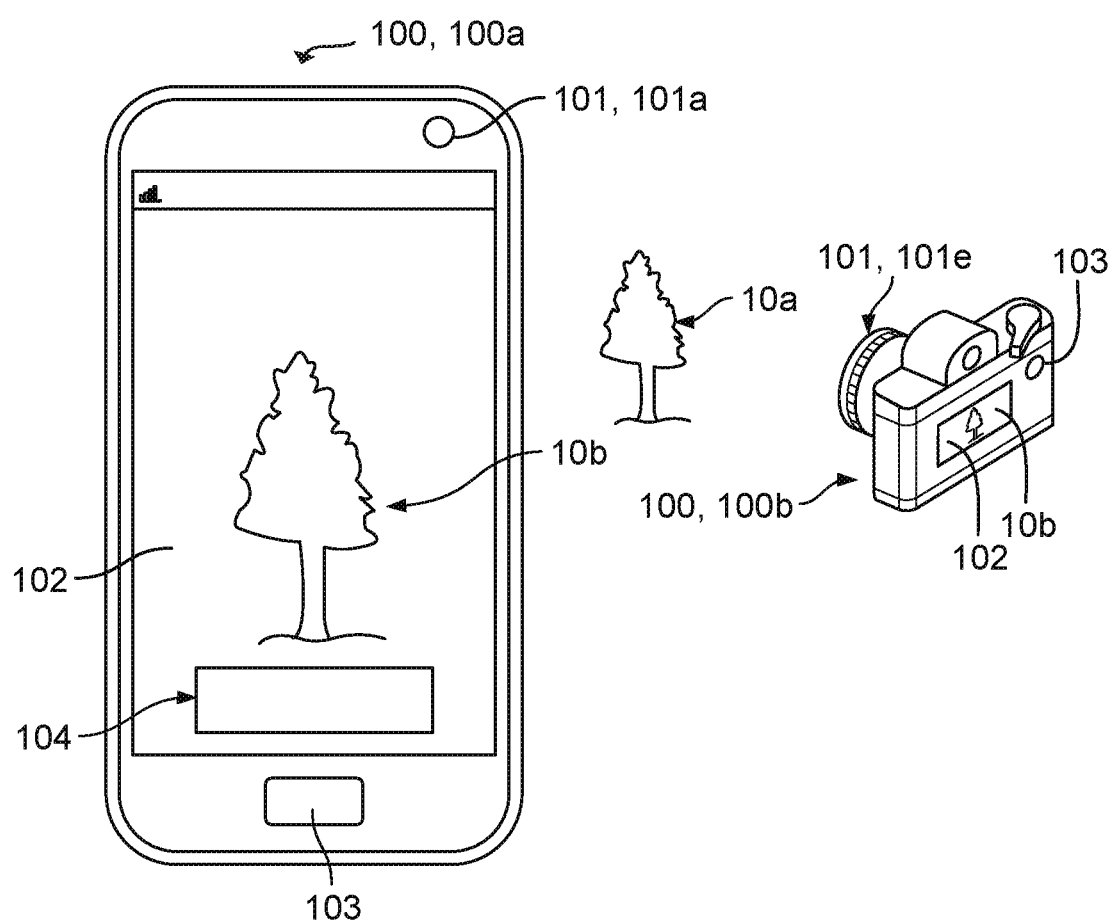
FIG. 1 shows example mobile devices imaging a scene.

The present application includes illustrative embodiments. Some claimed implementations will have different features than in the illustrative embodiments. Changes can be made without departing from the spirit of the disclosure. For example, features of the illustrative embodiments can be incorporated in different systems (e.g., devices) and methods.

At times, the present application uses directional terms (e.g., front, back, top, bottom, left, right, etc.) to give the reader context when viewing the Figures. Directional terms are for the reader's convenience and do not limit the claimed inventions to a particular orientation. Any absolute term can be replaced with a relative term (e.g., fast can be replaced with faster, slow can be replaced with slower). Any relative term can be replaced with a numbered term (e.g., left can be replaced with first, right can be replaced with second, and so on).

Among other things, the present application discloses techniques for determining (e.g., estimating, approximating, projecting) a scene dynamic range of a scene captured by a camera. A camera can include a sensor panel with first (e.g., slower) sensor pixels and second (e.g., faster) sensor pixels. All else being equal, first sensor pixels can take longer to saturate with photocurrent than second sensor pixels. First sensor pixels can be used to approximate a ceiling of the scene dynamic range while second sensor pixels can be used to approximate a floor of the scene dynamic range, as discussed in further detail below.

The processing system can perform automatic exposure control based on the scene dynamic range. During automatic exposure control, the processing system can adjust internal parameters of a camera to spread out sensor pixel measurements and to prevent clipping.

A top (e.g., ceiling) of a scene dynamic range is clipped when a camera records (i.e., captures) the same maximum photometrics for scene objects A and B. This is called overexposure. A bottom (e.g., floor) of a scene dynamic range is clipped when a capture records the same minimum photometrics for scene objects A and B. This is called underexposure.

The processing system can improve the image by spreading or diverging the channel values through automatic exposure control until the camera records sufficiently distinct photometrics for scene object A and scene object B. To correct overexposure, the processing system can increase the maximum scene light intensity that sensor pixels can capture. As a result, the camera can lift the dynamic range ceiling of the sensor pixels. To correct underexposure, the processing system can reduce the minimum light intensity that sensor pixels can capture. As a result, the camera can lower the dynamic range floor of the sensor pixels. To capture an entire span of scene dynamic range, the sensor pixel dynamic range floor can be less than or equal to the scene dynamic range floor and the sensor pixel dynamic range ceiling can be greater than or equal to the scene dynamic range ceiling.

Various techniques to increase exposure (i.e., fix underexposure) and reduce exposure (i.e., fix overexposure) are known in the art. To execute automatic exposure control, the processing system can perform one or more of the following example techniques.

First, the processing system can adjust sensor pixel integration time (i.e., how long each sensor pixel is effectively exposed to light). Integration time positively correlates with exposure level. Therefore, integration time can be increased during an underexposure event and reduced during an overexposure event.

Second, the processing system can adjust sensor pixel gain. The adjustment can be non-linear. To correct underexposure, the gain for low sensor pixel measurements can be nonlinearly increased. To correct overexposure, the gain for high sensor pixel measurements can be nonlinearly reduced.

Third, the processing system can adjust aperture size. Aperture size positively correlates with exposure level. To correct an underexposure event, aperture size can be increased. To correct an overexposure event, aperture size can be reduced.

Figure 2:
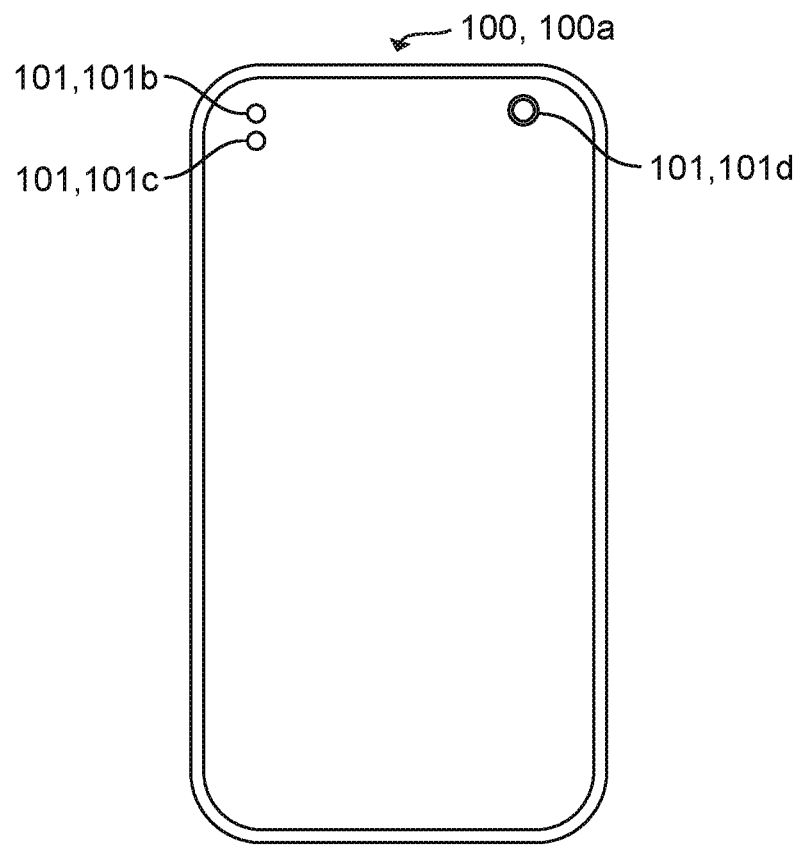
FIG. 2 shows a rear view of an example mobile device.

FIG. 1 shows mobile devices 100 imaging a scene 10*a*. Mobile device 100 can be a smartphone 100*a* or a dedicated camera assembly 100*b*. FIG. 2 shows a rear view of smartphone 100*a*. Mobile device 100 can include a processing system 400 (schematically shown in FIG. 4 and discussed below). Processing system 400 (PS 400) can include one or more cameras 101 (also called optical sensors, image sensors, and the like). Camera 101 can be a sensor 404 of PS 400 and include one or more of: one or more processors 401 (e.g., circuitry of sensor panel 121), memory 402, input-output devices 403, sensors 404 (e.g., photodiodes 805 of sensor panel 121), user-interfaces 405, and motors/actuators 406 (e.g., auto-focus motors). PS 400 can thus represent components that can be within camera 101 and/or a more global system that can include camera 101. Alternatively, camera 101 can be a component separate from processing system 400.

In some embodiments, PS 400 can be a processing system of mobile device 100 (e.g., one or more of smartphone 100*a* or dedicated camera assembly 100*b*). Besides camera 101, mobile device 100 can include, for example, a frame (not labeled), a display 102, and hard buttons 103. PS 400 can be configured to present soft or virtual buttons 104 on display 102.

As used herein, camera 101 can be any type of one or more digital image sensors. Therefore, the term "camera" encompasses digital image sensors of dedicated camera assemblies 100*b* and digital image sensors mounted to any type of device (e.g., a smartphone 100*a*, a vehicle, etc.).

PS 400 can be configured to enter a viewfinder mode. During viewfinder mode, PS 400 can present a stream of full-color images (e.g., samples of full-color images) on display 102. When the user presses a capture button (e.g., buttons 103 or 104), PS 400 can be configured to preserve a stable image in memory.

PS 400 can preserve the stable image in memory indefinitely (e.g., in non-volatile memory). The capture button can cause mobile device 100 to record a single image or multiple images, which represent frames of a video. Stable images are further discussed below.

Figure 3:
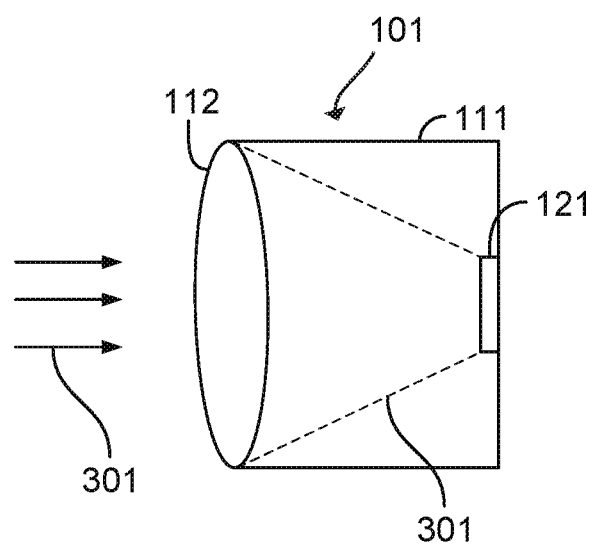
FIG. 3 shows a cross-sectional plan view of an example camera.

FIG. 3 is a schematic view of camera 101 (also called an image sensor package), which can be mounted in mobile device 100, or any other kind of system (e.g., a vehicle). Camera 101 can be representative of some or all of cameras 101a-101e shown in FIGS. 1 and 2.

Camera 101 can include a housing 111 retaining a lens 112 and a sensor panel 121 (also called an image sensor). As shown in FIG. 3, lens 112 can admit light 301 from a scene (e.g., scene 10a), and output converged light 301. A first portion of converged light 301 can be in-focus (e.g., substantially in-focus) on sensor panel 121. Therefore, the first portion of light 301 can represent the field of focus. The remainder of converged light 301 can be out-of-focus on sensor panel 121. Sensor panel 121 can measure converged light 301 with sensor pixels 501 (discussed below).

Although not shown, camera 101 can include multiple lenses and other optical elements such as moveable apertures, shutters, mirrors, and the like. Camera 101 can lack a moveable aperture (e.g., only include a fixed aperture). Camera 101 can include an actuator configured to move at least one lens. The actuator can be a motor. The actuator can move the lens in response to an autofocus command. PS 400 can issue an autofocus command based on phase detection sensor pixels (i.e., perform phase detection autofocus), as is known in the art.

Figure 4:
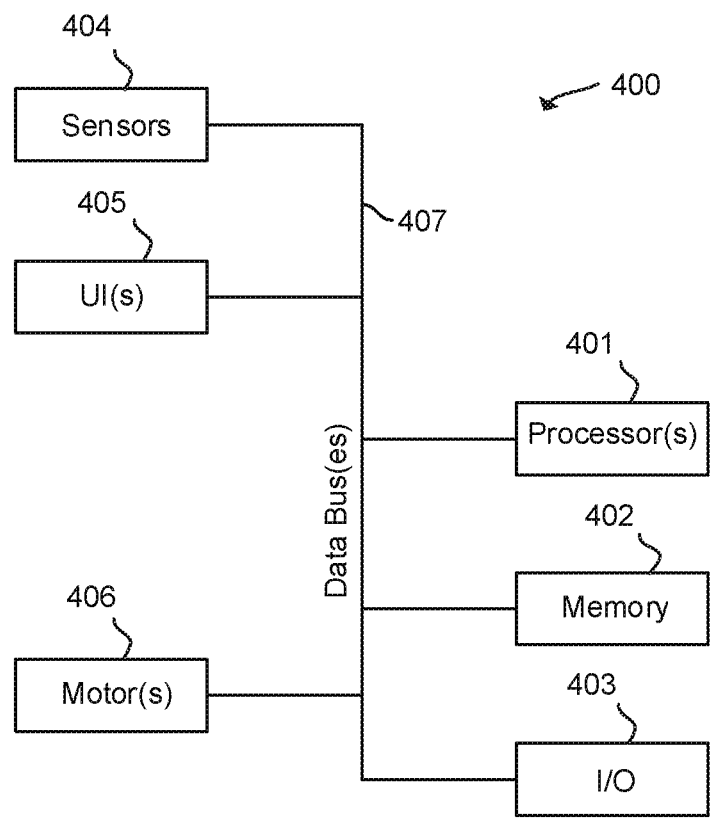
FIG. 4 is a block diagram of an example processing system.

Referring to FIG. 4, and as further addressed below, PS 400 can include one or more processors 401 and memory 402. According to some examples, camera(s) 101, display 102, and hard buttons 103, are aspects of PS 400 (e.g., depicted as sensors 404, UI(s) 405, and/or I/O 403). PS 400 can be configured to perform any of (e.g., all of) the functions, operations, and methods discussed in the present application. PS 400 can be present in any kind of device (e.g., a vehicle, a desktop computer, a smartphone, etc.).

Figure 5:
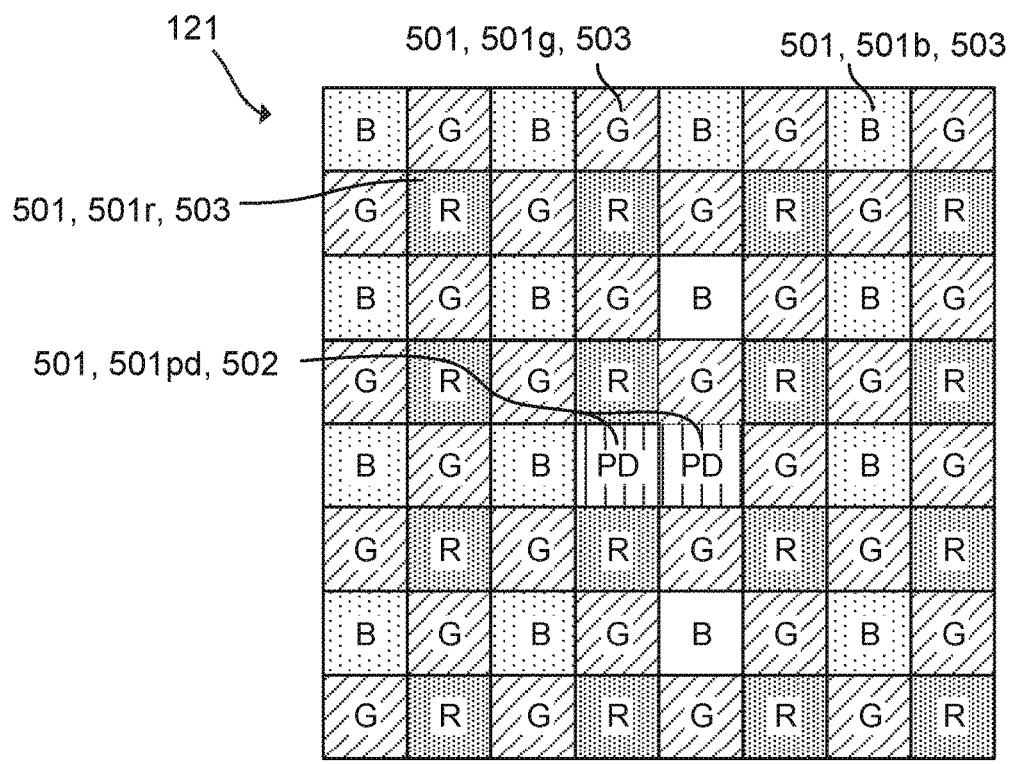
FIG. 5-7 show example sensor pixels in example sensor panels.
Figure 6:
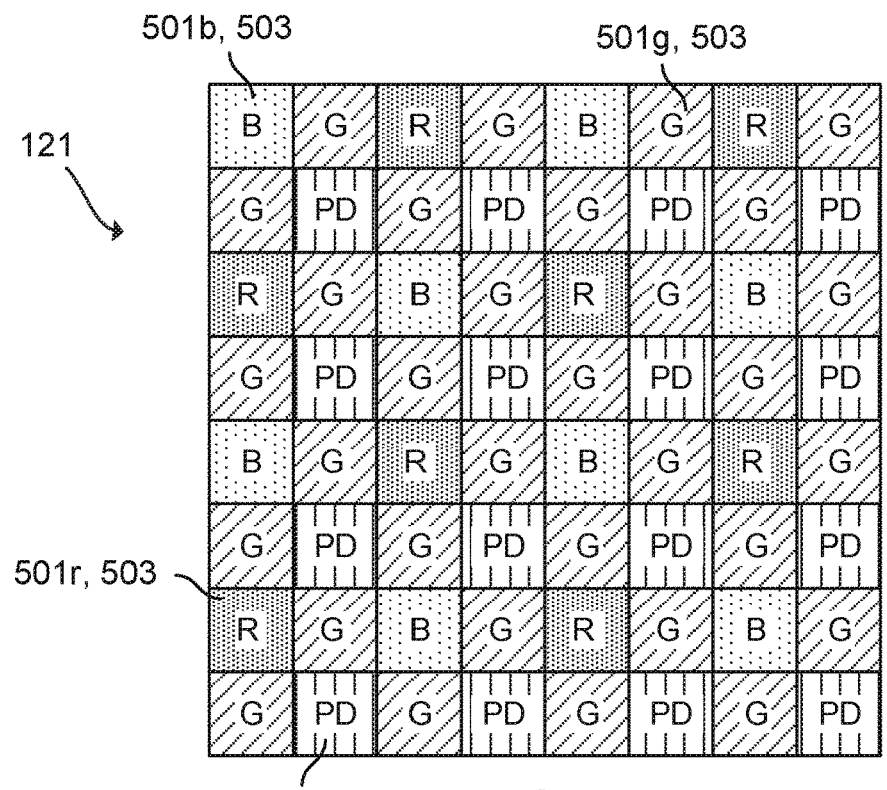
Figure 7:
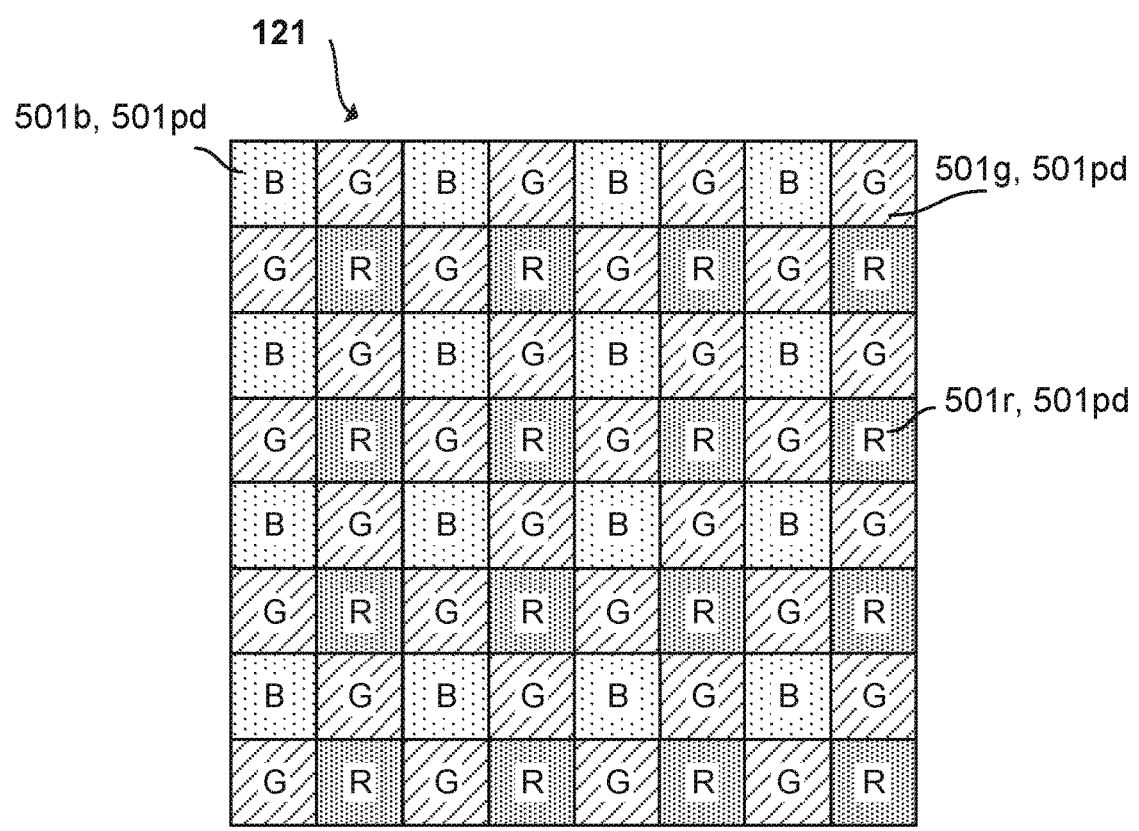

FIGS. 5-7 show example configurations of sensor panel 121 from a schematic top plan perspective. Sensor panel 121 can include different kinds of sensor pixels 501. "G" sensor pixels 501g can include a green color filter. "B" sensor pixels 501b can include a blue color filter. "R" sensor pixels 501r can include a red color filter. Any instance of the term "G" in the present application can be replaced with, for example, "first color" or "first spectral channel". Any instance of the term "B" in the present application can be replaced with, for example, "second color" or "second spectral channel". Any instance of the term "R" in the present application can be replaced with, for example, "third color" or "third spectral channel".

Sensor panel 121 can include phase detection ("PD") sensor pixels 501pd. PD sensor pixels 501pd can include any kind of color filter such as green, blue, red, infrared, clear, etc. In some embodiments, PD sensor pixels 501pd can lack a color filter.

Sensor panel 121 can include sensor pixels 501 with other types of color filters, such as clear color filters, infrared filters, etc. Some sensor pixels 501 can lack a color filter. Example sensor pixels 501 are discussed below with reference to FIGS. 8-13.

Although sensor pixels 501 are shown as being consecutive, sensor panel 121 can define gaps between adjacent sensor pixels 501 (not shown). The gaps (not shown) can be used for read-out circuitry, etc. FIGS. 5-7 schematically show sensor panel 121 as including sixty-four sensor pixels 501. In various embodiments, sensor panel 121 can include thousands or millions of sensor pixels 501.

Sensor pixels 501 can be categorized as slow sensor pixels 502 or fast sensor pixels 503. Example features of slow sensor pixels 502 and fast sensor pixels 503 are further discussed below. Each of the sensor pixels 501 can include photodiodes 805. Slow sensor pixels 502 can include slow photodiodes 806. Fast sensor pixels 503 can include fast photodiodes 807.

The terms fast and slow are relative, not absolute. For example, fast sensor pixels 503 can be faster than slow sensor pixels 502, but slower than fastest (i.e., faster) sensor pixels 503. As another example, and referring to the example embodiment in FIG. 13 (further discussed below), photodiodes 1201, 1203, and 1204 are fast compared with photodiode 1202 and photodiodes 1202, 1203, and 1204 are slow compares with photodiode 1201.

Slow photodiodes 806 can be configured to saturate with photocharge slower than fast photodiodes 807. For example, and all else being equal, slow photodiodes 806 can take "X" amount of time to saturate with photocharge and fast photodiodes 807 can take "X"/2 amount of time to saturate with photocharge. In some embodiments, slow sensor pixels 502 can be shielded 811 while fast sensor pixels 503 can be unshielded. Slow sensor pixels 502 can include more shielding than fast sensor pixels 503.

Referring to FIG. 5, and in some embodiments, PD sensor pixels 501pd can be slow sensor pixels 502 while the remaining sensor pixels 501r,g,b can be fast sensor pixels 503. In other embodiments, PD sensor pixels 501pd can be slow sensor pixels 502 while at least some of the remaining sensor pixels 501r,g,b can be slow sensor pixels 502 and at least some of the remaining sensor pixels 501r,g,b can be fast sensor pixels 503.

Similarly, in FIG. 6, and according to some embodiments, PD sensor pixels 501pd can be slow sensor pixels 502 while the remaining sensor pixels 501r,g,b can be fast sensor pixels 503. According to other embodiments, PD sensor pixels 501pd can be fast sensor pixels 503 while the other sensor pixels 501r,g,b are slow sensor pixels 502. In further embodiments, PD sensor pixels 501pd can be slow sensor pixels 502 while some of the other sensor pixels 501r,g,b are slow sensor pixels 502 and some of the other sensor pixels 501r,g,b are fast sensor pixels 503.

In FIG. 7, and according to various embodiments, any (e.g., all) of the illustrated R, G, B sensor pixels 501r,g,b can function as PD sensor pixels 501pd. Any of the sensor pixels 501 of FIG. 7 can be slow sensor pixels 502 or fast sensor pixels 503. As addressed below, each of the sensor pixels 501 of FIG. 7 can include fast photodiodes 807 and slow photodiodes 806.

Referring to FIGS. 5-7, and in some embodiments, a predetermined fraction (e.g., 1/10) of G, B, and R sensor pixels 501g,b,r can be slow sensor pixels 502 while the remaining fraction (e.g., 9/10) of G, B, and R sensor pixels 501r,g,b can be fast sensor pixels 503. In other embodiments, only one category of G, B, and R sensor pixels 501r,g,b can include slow sensor pixels 502. For example, a predetermined fraction (e.g., 1/10) of G sensor pixels 501g can be slow sensor pixels 502 while the remaining fraction (e.g., 9/10) of G sensor pixels 501g can be fast sensor pixels 503. According to this example, all B and R sensor pixels 501b,r can be fast sensor pixels 503.

FIGS. 5-7 show only three of many different possible sensor panel 121 configurations. Therefore, sensor panels 121 of FIGS. 5-7, as with all features disclosed in the present application, are only examples. Sensor panel 121 can have many different configurations.

Figure 12:
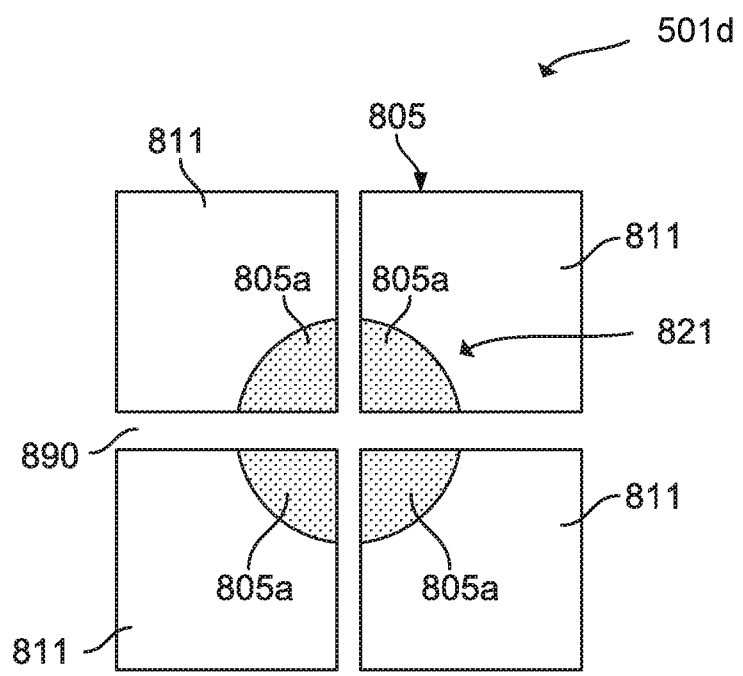
Figure 13:
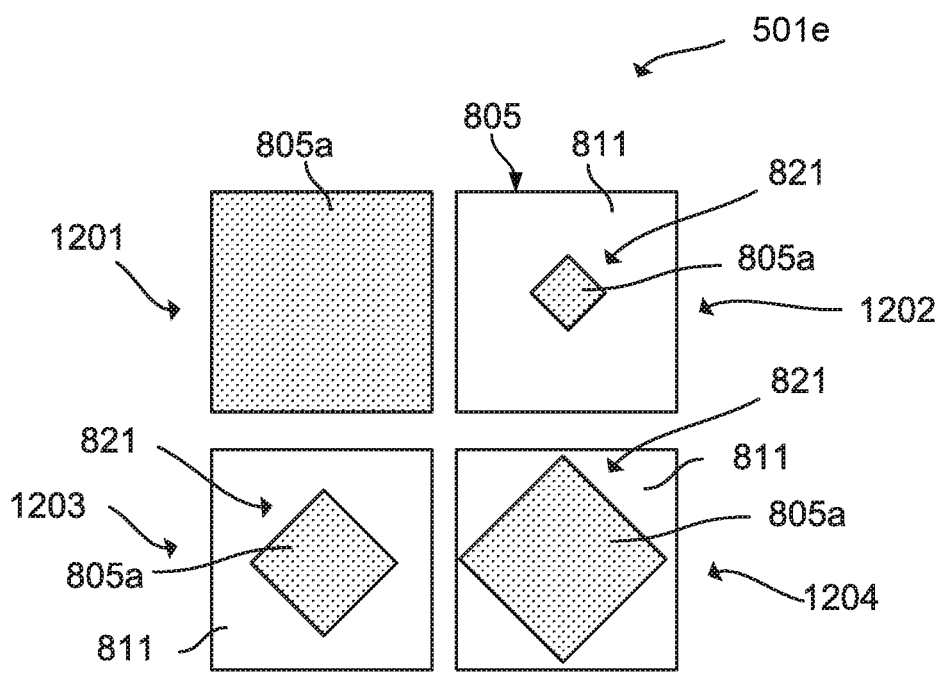
Figure 14:
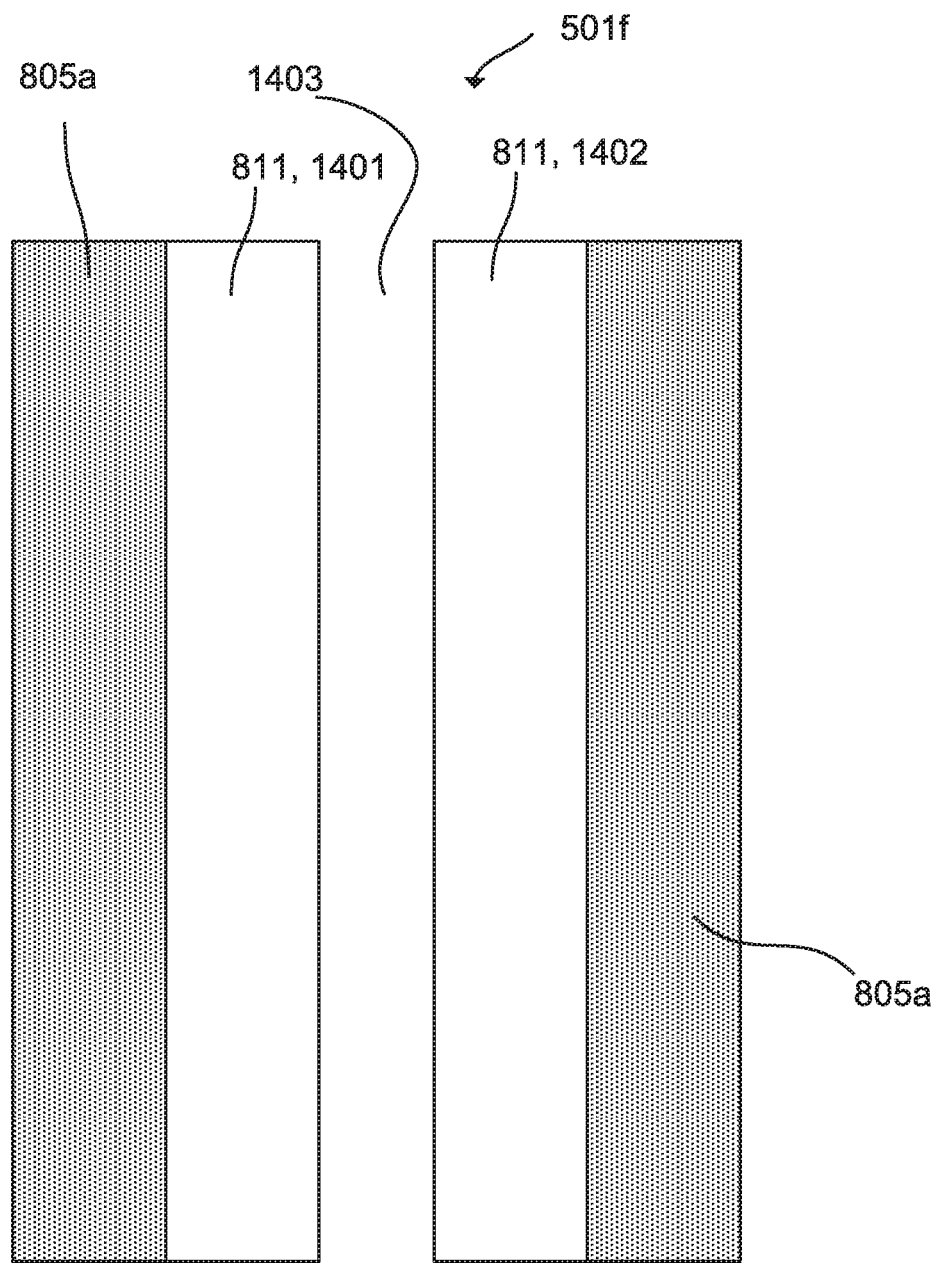

FIGS. 8-14 show possible sensor pixels 501. FIGS. 8-11 are in cross sectional side elevational schematic. In FIGS. 8-11, light flows from top to bottom. FIGS. 12-14 are in top plan schematic. In FIGS. 12-14, light flows into the page. The sensor pixels 501 shown in FIGS. 8-14 can be representative of any of the sensor pixels 501 in FIGS. 5-7. PS 400 can include each of the sensor pixel configurations shown in FIGS. 8-14 (e.g., on a different sensor panels 121).

FIG. 8 shows an example first sensor pixel 501a. First sensor pixel 501a can include a microlens 801, a color filter 802, a spacer layer 803, and a respective portion of a substrate 804. Substrate 804 can include a photodiode 805. First sensor pixel 501a can include one or more photodiodes 805. Each of the one or more photodiodes 805 can be fast photodiodes 807. First sensor pixel 501a can be a G, B, R, and/or PD sensor pixel 501r,g,b,pd. First sensor pixel 501a can correspond to fast sensor pixels 503.

Microlens 801 can be dome-shaped. A dome-shaped microlens 801 can include a flat top and thus have a trapezoidal-hemispherical shape. Microlens 801 can be fully hemispherical (e.g., ½ of a sphere). As with any features disclosed herein, microlens 801 is optional and can be absent.

Microlens 801 can be disposed in a different optical location (e.g., optically downstream of color filter 802). Microlens 801 can represent a single, unitary microlens 801 that covers photodiode 805. The lateral position of microlens 801 with respect to photodiode 805 can vary across sensor panel 121.

Microlens 801 of centrally disposed sensor pixels 501 can cover photodiode 805 by being disposed directly vertically above photodiode 805. Microlens 801 of peripherally disposed sensor pixels 501 can cover photodiode 805 by being laterally offset from photodiode 805. Microlens 801, if present, can be made from a drop of clear resin. The resin can be a polymer. The resin can be a glass.

Color filter 802 can be configured to admit a first spectrum of light and block remaining light. For example, a blue color filter can admit blue light while blocking non-blue light. As addressed above, multiple different color filters 802 can form a color filter array.

Each of FIGS. 5-7 shows an example color filter array with repeating color filter patterns. FIG. 7 shows a pure Bayer pattern. FIG. 5 shows a Bayer with phase detection pattern. Color filter 802 can be green, blue, red, clear, infrared, black, violet, cyan, magenta, yellow, etc. In some embodiments, color filter 802 can lie optically downstream of microlens 801 and optically upstream of photodiode 803. In other embodiments, color filter 802 can lie optically upstream of microlens 801 (not shown). In further embodiments, color filter 802 can be absent for some or all sensor pixels 501. Color filter 802, if present, can be made from a rectangular (e.g., square) resin. The resin can be a polymer. The resin can be a glass.

Spacer layer 803 can represent an absence of material (e.g., a void). Spacer layer 803 can be absent in some embodiments. In other embodiments, spacer layer 803 can be charged with a clear resin. The resin can be a polymer. The resin can be a glass. Spacer layer 803, if present, gives microlens 801 additional vertical room to converge light onto photodiode 805. Although not shown, circuitry and other features of substrate 804 (e.g., photodiode 805) can protrude into spacer layer 803 according to various embodiments. In some embodiments, spacer layer 803 can be optically downstream of microlens 801 and color filter 802. In other embodiments, spacer layer 803 can be optically upstream of photodiode 805.

Substrate 804 can be made from silicon. Substrate 804 can include circuitry (not shown). Substrate 804 can include multiple photodiodes 805. Photodiode 805 can be a complementary metal-oxide semiconductor ("CMOS") photosensor, a charge-coupled device ("CCD") photosensor, or any other kind of photosensor. Photodiode 805 can be optically downstream of microlens 801 and color filter 802.

Photodiode 805 can have a light receiving surface area 805a and a photocharge well 805b. Although shown as linear, light receiving surface area 805a can be non-linear (e.g., include peaks and valleys). Light receiving area 805a can be the exposed portion of photodiode 805 when viewed from a top plan perspective.

Photodiode 805 can be configured to receive scene light through light receiving area 805a (also called an unmasked/unshielded photosensitive area). Photodiode 805 can convert the received scene light into photocurrent at a predetermined efficiency level. Photodiode 805 can store the photocurrent as photocharge in photocharge well 805b. Photocharge well 805b can have a maximum capacity.

Photodiode 805 can produce a maximum photometric in response to photocharge well 805b being saturated (e.g., filled). Photodiode 805 can produce the maximum photometric in response to photocharge well 805b being oversaturated. Oversaturation can occur when (a) more photocharge accumulates in well 805b than PS 400 is capable of reading and/or (b) photocharge deposited in well 805b leaks due to well 805b being saturated.

Photodiode 805 can produce a minimum photometric (e.g., a zero reading) in response to photocharge well 805b being empty (e.g., being completely empty or having a photocharge quantity less than a predetermined activation quantity). As discussed with reference to FIGS. 12 and 13, photodiode 805 can represent multiple different photodiodes 805.

Sensor panel 121 can be an aspect of PS 400 (e.g., a sensor 404). PS 400 can integrate sensor pixels 501 on a global or rolling basis. Integration can include a series of operations. First, PS 400 can select certain sensor pixels 501 (e.g., a row of sensor pixels 501, all sensor pixels 501). Second, PS 400 can clear (also called resetting) the selected sensor pixels 501 (e.g., by emptying photocharge wells 805b of the selected sensor pixels 501). Third, PS 400 can wait while the selected sensor pixels 501 accumulate photocurrent as photocharge. Fourth, PS 400 can read out the photocharge levels of each photodiode 805 of the selected sensor pixels 501.

Integration time can be the time difference between readout and clearing. During rolling integration, different sensor pixels 501 can be integrated at different absolute times but the integration time of each of the sensor pixels 501 can be the same.

FIGS. 9 and 10 discuss a second sensor pixel 501bb. FIG. 9 shows a first embodiment thereof 501bbx. FIG. 10 shows a second embodiment thereof 501bby. Second sensor pixel 501bb can include a microlens 801, a color filter 802, a respective portion of a substrate 804, a photodiode 805, and shielding (also called masking) 811. Second sensor pixel 501bb can be equal to (e.g., substantially the same as) first sensor pixel 501a (FIG. 8) except for shielding 811. Second sensor pixel 501bb can be a G, B, R, or PD sensor pixel 501r,g,b,pd. Second sensor pixel 502 can include one or more slow photodiodes 805, 806.

Shielding 811 can be opaque (e.g., substantially light impermeable or completely light impermeable). In some embodiments, shielding 811 can be metallic (e.g., aluminum). In other embodiments, shielding 811 can be made from an opaque (e.g., dark black) resin. FIG. 9 shows possible locations of shielding 811 including a first location 812 and a second location 813.

Referring to FIG. 9, shielding 811 can be present at either of locations 812, 813. When at location 812, shielding 811 can be applied directly above photodiode 805. When at location 813, shielding 811 can be applied directly below color filter 802. Although not shown, shielding 811 can exist at any location (e.g., in the middle of spacer layer 803, above microlens 801, between microlens 801 and color filter 802, and so on).

Shielding 811 can have a closed outer perimeter and a closed inner perimeter. Shielding 811 can define a central aperture 821. Shielding 811 can enable passage of light through central aperture 821. Shielding 811 can reduce the light receiving area 805a of photodiode 805. As shown in FIG. 10, light receiving area 805a is now only located at the center of photodiode 805. The periphery of photodiode 805 is masked 805c. As shown in FIG. 10, color filter 802 can be disposed within central aperture 821.

FIG. 11 shows an example third sensor pixel 501c. In some embodiments, third sensor pixel 501c can be identical to first sensor pixel 501a (FIG. 8) and/or second sensor pixel 501bb (FIG. 9 or FIG. 10), except for the disposition of shielding 811.

In third sensor pixel 501c, shielding 811 can be disposed over a first (e.g., right) portion (e.g., half) 814x of photodiode 805 to define light receiving area 805ax. As shown in broken lines, shielding 811 can alternatively be disposed over a second (e.g., left) portion (e.g., half) 814y of photodiode 805 to define light receiving area 805ay. Some third sensor pixels 501c can include shielding at first location 814x while other third sensor pixels 501c can include shielding at second location 814y.

In some embodiments, two third sensor pixels 501c can be disposed directly next to each other to define a phase detection pixel pair. For example, PD sensor pixels 501pd in FIG. 5 can represent a phase detection pixel pair. One of the PD sensor pixels 501pd can include shielding 811 at 814x (see FIG. 11), while the other of the PD sensor pixels 501pd can include shielding at 814y (see the broken lines in FIG. 11 depicting the alternate embodiment).

FIG. 12 shows an example fourth sensor pixel 501d including multiple (e.g., four) photodiodes 805. Each can be fast or slow photodiodes 806, 807. Any of the sensor pixels 501 discussed herein can include any number of (e.g., one, two, four, etc.) of photodiodes 805. Second sensor pixels 501bb can be fourth sensor pixels 501d. PS 400 can be configured to independently read out each photodiode 805 of each of the sensor pixels 501 (e.g., fourth sensor pixel 501d). Fourth sensor pixel 501d can include any of the features discussed with reference to FIGS. 8-11 (e.g., a microlens 801, a color filter 802, a spacer layer 803, etc.).

Fourth sensor pixel 501d can include peripheral shielding 811. As shown, peripheral shielding 811 can be discontinuous due to small gaps 890 between adjacent photodiodes 805. Although not shown, peripheral shielding 811 can be continuous.

Peripheral shielding 811 can define a central aperture 821, which reveals light receiving area 805a, which is shown to occupy a pie-shaped corner of each photodiode. Shielding 811 can be absent or rearranged (discussed below). A microlens 801 can cover photodiodes 805 of fourth sensor pixel 501d (see FIGS. 8-11). An optical axis of light converged by microlens 801 can pass through the center of the effective circle produced by the sum of light receiving areas 805a.

FIG. 13 shows an example fifth sensor pixel 501e. Shielding 811 can be disposed to define different central apertures 821. Each central aperture 821 can be defined over the two-dimensional centroid of one photodiode 805. Each central aperture 821 can have a different size. Each central aperture 821 can be circular, square, diamond shaped, etc. According to some embodiments, one photodiode 805, 1201 can lack shielding 811 and the remaining three photodiodes 805, 1202-1204 can include shielding 811 defining three respective central apertures 821 of different sizes.

FIG. 14 shows an example sixth sensor pixel 501f including multiple (e.g., two) photodiodes 805. Sixth sensor pixel 501f can include elongated photodiodes 805. Adjacent sides of elongated photodiodes 805 can be covered by shielding 811. The shielding 811 can include a first shield 811, 1401 and a second shield 811, 1402. Therefore, opposite sides of elongated photodiodes 805 can define light receiving surfaces 805a such that shielding 1401, 1402 is disposed in-between the pair of light receiving surfaces 805a. A gap 1403 is shown as separating photodiodes 805. In some embodiments, gap 1403 can be absent such that adjacent sides of photodiodes 805 are in direct contact with each other. In some embodiments (not shown), shielding 1401, 1402 can be swapped with light receiving surfaces 805a such that the pair of light receiving surfaces 805a are disposed in-between the shielding 1401, 1402.

As previously discussed, sensor pixels 501 can be slow sensor pixels 502 or fast sensor pixels 503. Similarly, photodiodes 805 can be slow photodiodes 806 or fast photodiodes 807. All else being equal, fast sensor pixel photodiodes 807 can saturate more quickly with photocharge than slow sensor pixel photodiodes 806. Slow sensor pixels 502 and slow photodiodes 806 can have a first photosensitivity, a first light receiving area 805a, and a first photocharge well depth 805b. Fast sensor pixels 503 and fast photodiodes 807 can have a second photosensitivity, a second light receiving area 805b, and a second photocharge well depth 805b.

In some embodiments, the first photosensitivity can be less than the second photosensitivity, the first light receiving area 805a can be equal to the second light receiving area 805a, and the first well depth 805b can be equal to (e.g., the same or substantially the same as) the second well depth 805b. In other embodiments, the first photosensitivity (which can be surface area independent) can be equal to the second photosensitivity, the first light receiving area 805a can be smaller than the second light receiving area 805a, and the first well depth 805a can be equal to the second well depth 805a. In further embodiments, the first and second photosensitivities can be equal, the first and second light receiving areas 805a can be equal, and the first well depth 805b can be deeper than the second well depth 805b. Slow sensor pixels 502 and slow photodiodes 806 can include any combination of the above saturation delaying features.

Saturation time can be the amount of time, all else being equal, that a particular one of the sensor pixels takes to saturate with photocharge in well 501b. Fast sensor pixels 503/fast photodiodes 807 can be configured to saturate faster (i.e., have lower saturation times) than slow sensor pixels 502/slow photodiodes 806. However, during use, if a fast sensor pixel 503/fast photodiode 807 maps to a dark scene object and a slow sensor pixel 502/slow photodiode 806 maps to a bright scene object, then the slow sensor pixel 502/slow photodiode 806 may saturate quicker than the fast sensor pixel 503/fast photodiode 807.

Unless otherwise indicated, the present disclosure discusses saturation time in terms of configuration, which is independent of any specific imaging event. For convenience, the present disclosure uses the following conventions to compare the saturation times of different sensor pixels 501 and different photodiodes 805. These conventions are only for convenience and ease of explanation and are not intended to limit the claimed inventions.

First, each of the sensor pixels 501 has the same two-dimensional area, which is covered by a singlet-photodiode 805 (e.g., as depicted in FIGS. 8-11), two dual-photodiodes 805 (e.g., as depicted in FIG. 14), or four quad-photodiodes 805 (e.g., as depicted in FIGS. 12 and 14). As a result, the light receiving area 805a of any unshielded sensor pixel (e.g., first sensor pixel 501a) is assumed to be constant, no matter whether the sensor pixel (e.g., first sensor pixel 501a) includes a singlet-photodiode 805, dual-photodiodes 805, or quad-photodiodes 805.

Second, the photosensitivity (defined to be area independent) of each singlet, dual, and quad-photodiode 805 is assumed to be the same. Third, the photocharge well capacity 805b of a singlet photodiode is assumed to be twice as large as the well capacity 805b of a single dual-photodiode, which is assumed to be twice as large as the well capacity 805b of a single quad-photodiode. Fourth, no sensor pixels 501 include a microlens 801. Fifth, the sensor pixels 501 are located in the same general area of sensor panel 121 and receive the same light.

Given these assumptions: First sensor pixel 501a (and its corresponding photodiode(s) 805) can have the shortest saturation time (i.e., be structurally configured to have the shortest saturation time) due to the lack of shielding 811. Third sensor pixel 501c and sixth sensor pixel 501f (and their corresponding photodiode(s) 805) can have equal (e.g., substantially similar) intermediate saturation times. Second sensor pixel 501b and fourth sensor pixel 501d (and their corresponding photodiode(s) 805) can have the longest saturation times. All else being equal, unshielded singlet, dual and quad-photodiodes 805 can have fast and equal saturation times.

Each photodiode 805 of fifth sensor pixel 501e can have a different saturation time. Photodiode 805, 1201 with the least shielding 811 can have the fastest saturation time while photodiode 805, 1202 can have the slowest saturation time.

Referring to FIG. 5, PD sensor pixels 501pd can be third sensor pixels 501c. Each PD sensor pixel 501pd can include only a single photodiode 805 or multiple photodiodes 805. Adjacent PD sensor pixels 501pd can have opposite shielding 811. For example, the right PD sensor pixel 501pd of FIG. 5 can have shielding at first location 814x while the left PD slow sensor pixel 501pd of FIG. 5 can have shielding at second location 814y. Adjacent PD sensor pixels 501pd can form a phase detection pixel group. A single microlens 801 can cover each phase detection pixel group. Although not shown, sensor panel 121 of FIG. 5 can include multiple phase detection pixel groups.

In FIG. 5, each PD sensor pixel 501pd can be a slow sensor pixel 502. R, G, and B pixels 501r,g,b can be fast sensor pixels 503. R, G, and B sensor pixels 501r,g,b can each be first sensor pixels 501a. R, G, and B sensor pixels 501r,g,b can each include one or more photodiodes 805. According to various embodiments: each photodiode 805 can be unshielded; some of R, G, and B sensor pixels 501r,g,b can be unshielded while other R, G, and B sensor pixels 501r,g,b can be shielded; only one of R, G, and B sensor pixels 501r,g,b can include shielded sensor pixels (e.g., ¹/₁₀ of all B sensor pixels 501b) can include shielding 811; none of G sensor pixels 501g can include shielding 811; the R, G, and/or B sensor pixels 811r,g,b with shielding 811 can be second sensor pixels 501bb, etc.

Referring to FIG. 6, PD sensor pixels 501pd can be slow sensor pixels 502 (i.e., slower than other PD sensor pixels 501pd such as fast sensor pixels 503—discussed below). PD sensor pixels 501pd can be second sensor pixels 501bb (with a smaller central aperture 821), third sensor pixels 501c, fourth sensor pixels 501d (with a larger central aperture 821), fifth sensor pixels 501e, or sixth sensor pixels 501e. R, G, and B sensor pixels 501 can each be fast sensor pixels 503 (i.e., faster than other PD sensor pixels 501pd, such as slow sensor pixels 502). R, G, and B sensor pixels 501 can be first sensor pixels 501a, second sensor pixels 501bb (with a larger central aperture 821), fourth sensor pixels 501d (with a larger central aperture 821), or fifth sensor pixels 501e.

Referring to FIG. 7, each of the sensor pixels 501 can be a second/fourth/fifth sensor pixel 501bb/501d/501e. If each of the sensor pixels 501 is a fifth sensor pixel 501e, some sensor pixels 501 can include smaller apertures 821 and others can include larger apertures 821. Each R, G, and B sensor pixel 501r,g,b can include multiple photodiodes 805, but a certain percentage of G sensor pixels 501g can include shielding as in fourth sensor pixel 501d, while the remaining sensor pixels 501 can be unshielded (see, for example, first sensor pixel 501a). Each of the sensor pixels 501 can be a sixth sensor pixel 501f. Some of the sixth sensor pixels 501f can be rotated 90 degrees with respect to the other sixth sensor pixels 501f.

Figure 15:
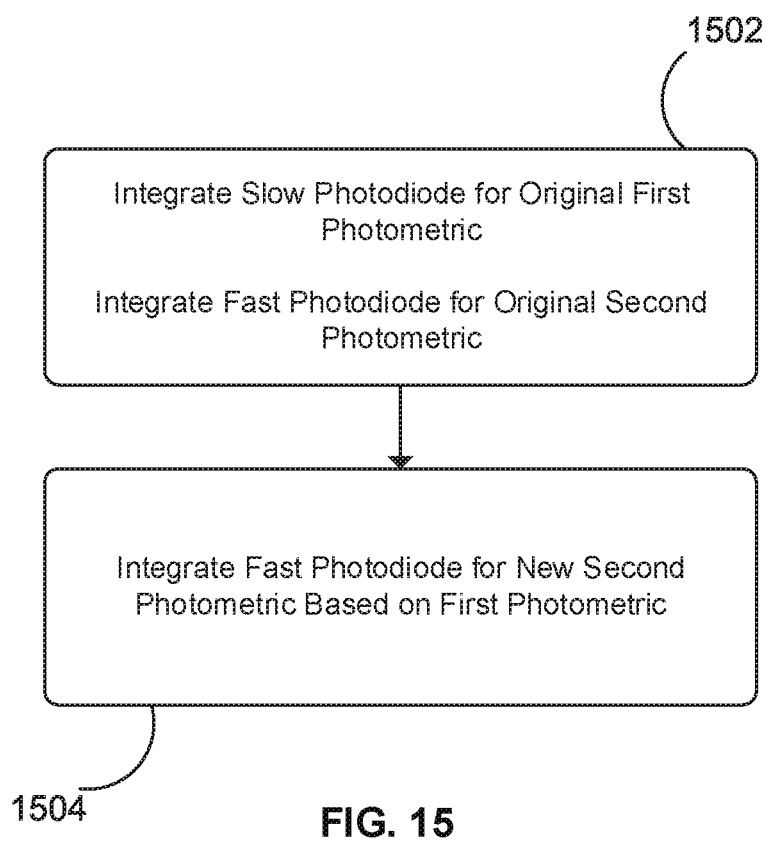
FIG. 15 shows a method of performing automatic exposure control based on slow and fast photodiodes (i.e., slow and fast sensor pixels).

FIG. 15 shows an example method of automatic exposure control (AEC). As with all methods and operations disclosed herein, PS 400 can be configured to perform the method of FIG. 15.

At block 1502, PS 400 can capture a scene. PS 400 can do so by integrating slow photodiodes 805 of first sensor pixels 501 for a first amount of time and integrating fast photodiodes 805 of second sensor pixels 501 for a second amount of time. The slow photodiode 805 can be configured to saturate with photocharge slower than the fast photodiode 805. As previously discussed, a slow photodiode 805 can be configured to saturate with photocharge slower than a fast photodiode 805, but still accumulate a greater amount of photocharge than the fast photodiode 805 due to differences in scene light intensity.

Although integrated for the same amount of time, the fast and slow photodiodes 806 can be integrated at different absolute times (e.g., if PS 400 performs rolling integration). The slow photodiode 805 can be any slow photodiode 805 disclosed herein. The fast photodiode 805 can be any fast photodiode 805 disclosed herein.

At block 1504, PS 400 can re-capture the scene. To do so, PS 400 can integrate the fast photodiode 805 for a second amount of time to produce a newer second photometric. The second amount of time can be based on the original first photometric. The second amount of time can be less than the first amount of time.

Because sensor pixels 501 comprise photodiodes 805, any operations performed by a photodiode 805 can be understood as being performed by its corresponding sensor pixel 501. For example, assume that sensor pixel X comprises photodiodes Y and Z. When photodiode Y is integrated, sensor pixel X can be understood as being integrated. And when photodiode Z is integrated, sensor pixel X can be understood as being integrated. The same concept applies to other features (e.g., properties or characteristics) of photodiodes. For example, if photodiode Y has a first photocharge capacity and photodiode Z has a second photocharge capacity, then sensor pixel X can be understood as including the first photocharge capacity and/or the second photocharge capacity.

Therefore, any reference in the present disclosure about a photodiode 805 (including the properties thereof) can be replaced with a reference to the sensor pixel 501 including the photodiode 805. And any discussion about a sensor pixel 501 (including the properties thereof) can be replaced with a reference to the one or more photodiodes 805 corresponding to the sensor pixel 501.

Figure 16:
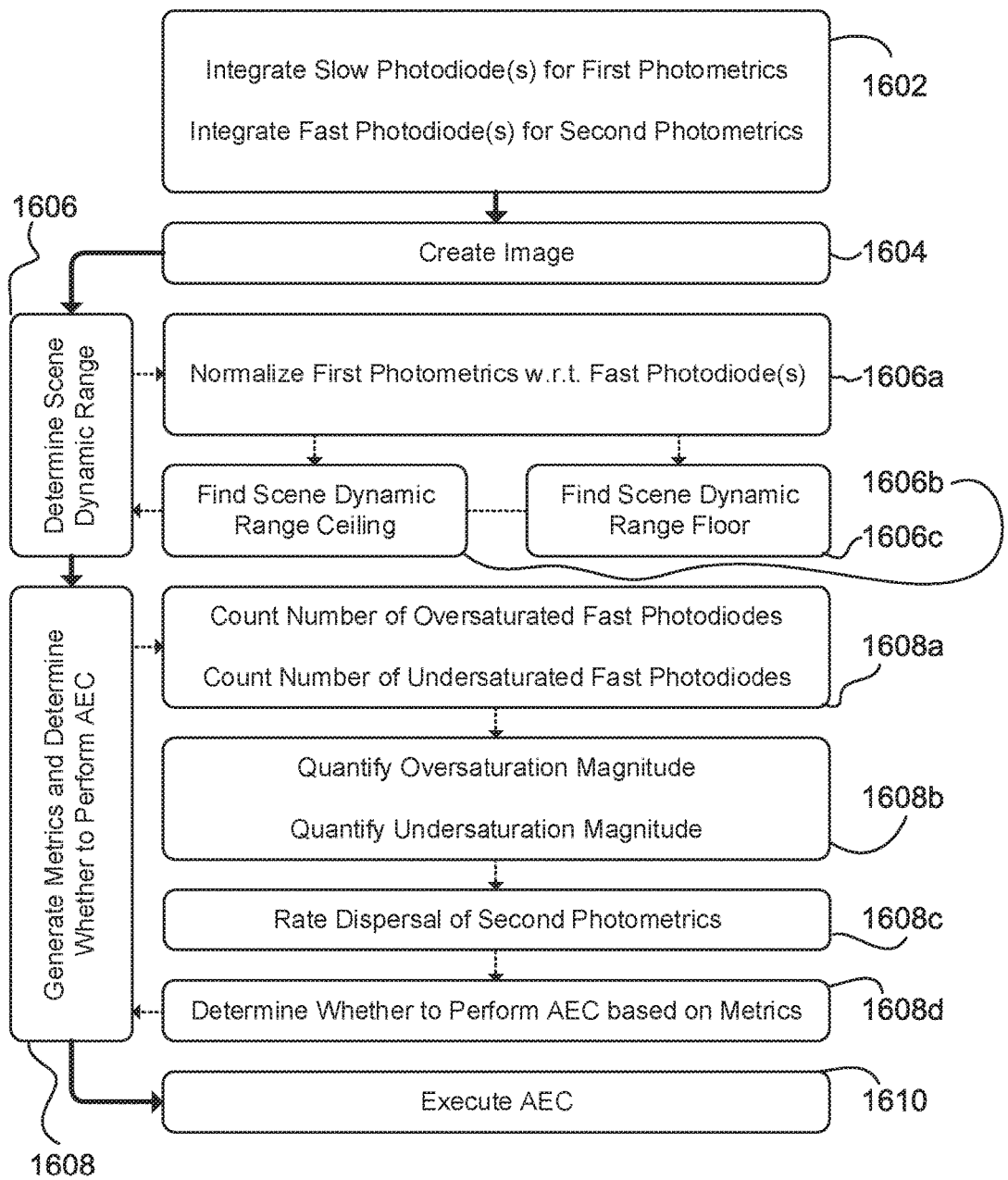
FIG. 16 shows a method of performing automatic exposure control based on two or more of slow, fast, and fastest photodiodes (i.e., slow, fast, and fastest sensor pixels).

FIG. 16 shows an example method of automatic exposure control (AEC). As with all methods and operations disclosed herein, PS 400 can be configured to perform the method of FIG. 16.

The method can generally include capturing a scene by integrating a first sensor pixel 501 (e.g., a first photodiode 805 thereof) for a first amount of time to produce an original first photometric and integrating a second sensor pixel 501 (e.g., a second photodiode 805 thereof) for the first amount of time to produce an original second photometric. The first sensor pixel 501 (e.g., the first photodiode 805 thereof) can be configured to saturate with photocharge slower than the second sensor pixel 501 (e.g., the second photodiode 805 thereof).

The method can include re-capturing the scene by integrating the second sensor pixel 501 (e.g., the second photodiode 805 thereof) for a second amount of time to produce a newer second photometric. The second amount of time can be based on the original first photometric. The second amount of time can be less than the first amount of time.

Referring to FIG. 16, and at block 1602, PS 400 can integrate a plurality of first sensor pixels 501 and a plurality of second sensor pixels 501. The integration can happen simultaneously or sequentially. The first and second sensor pixels 501 can be any of sensor pixels 501*a*-501*f*. The first sensor pixels 501 can be slow sensor pixels 502 and thus include one or more slow first photodiodes 806. The second sensor pixels 501 can be fast sensor pixels 503 and thus include one or more second fast photodiodes 807.

The first sensor pixels 501 and the second sensor pixels 501 can be structurally identical and each include a slow photodiode 805 and a fast photodiode 805 (e.g., fifth sensor pixel 501*e* of FIG. 13). The slow photodiode 806 can be any photodiode of sensor pixels 501*a*-501*f*. The fast photodiode 807 can be any photodiode of sensor pixels 501*a*-501*f*. The slow photodiode 806 can have a smaller light receiving area 805*a* than the fast photodiode 807. The slow photodiode 806 can be otherwise identical (e.g., configured to be identical) as the fast photodiode 807.

At block 1602, PS 400 can read out first analog photometrics of the slow photodiodes 806 and second analog photometrics of the fast photodiodes 807. As discussed above, read-out can represent the final step in photodiode integration.

At block 1604, PS 400 can create an image (e.g., a mosaic and/or a full-color image) with the photometrics. Block 1604 can include converting the first and second analog photometrics into first and second digital photometrics (e.g., channel values). When the present disclosure refers to photometrics, the photometrics can be in analog or digital form. The photometrics can quantify light brightness (e.g., intensity).

An image can include many different image pixels. In some embodiments, each image pixel can spatially map to one sensor pixel. For an example, an image pixel with coordinates (1, 1) can map to a sensor pixel with coordinates (1, 1), an image pixel with coordinates (x, y) can map to a sensor pixel with coordinate (x, y), and so on. In other embodiments, each image pixel can map to a cluster of multiple sensor pixels, or vice versa.

Each image pixel can have one or more color channels. A color channel can be one of multiple predetermined options, determined according to a desired color space. In RGB color space, each image pixel can include a red, a green, and/or a blue color channel. Other color spaces (e.g., CIE) are consistent with the present disclosure. As used herein the term color can also refer to non-visible light spectrum such as infrared light.

Each color channel can have a color value falling within a predetermined range such as 0-255 (8-bits per channel), 0-511 (9-bits per channel), 0-1023 (10-bits per channel), 0-2047 (11-bits per channel), and so on. The color value can indicate a magnitude of the color channel. At least one color value of an image pixel can be based on the photometric(s) captured by the photodiode(s) mapping to the image pixel. For example, a color value of zero can indicate a color channel with zero magnitude. For clarity, image pixels are considered to include a color channel when the color value thereof is zero. Image pixels do not include a color channel when the color value thereof is unassigned.

Images can have different stages and exist in different states. Stages can include a mosaic stage and a full-color stage. States can include a transient state and a stable state. When the present disclosure refers to an image, the image can be a portion or patch of a larger image. In some embodiments, the image can represent an entire and complete image. In some embodiments, image can be a video frame.

In a mosaic stage, each image pixel can include fewer color channels than are required for a full-color image (as determined by the desired color space). According to some examples, each image pixel in an image mosaic (i.e., an image in a mosaic stage) can include a single color channel, and thus a single color value. Each image pixel in an image mosaic can include a single color channel but a different color value for each photodiode of the corresponding sensor pixel. In a full-color stage, each image pixel includes a number of color channels equal to the number required by the desired color space. For example, in RGB color space, each image pixel includes three color channels (red, green, and blue).

A mosaic can have a color pattern. PS 400 can initially capture an image in a mosaic stage with a color pattern matching the arrangement of the color filters. For example, if PS 400 captured an image mosaic with sensor panel 121 of FIG. 7, the top left image pixel would have a blue color channel and color value(s) determined by photocharge(s) collected by the photodiode(s) of the corresponding sensor pixel. Therefore, in some examples, each of the sensor pixels 501 shown in FIGS. 5-7 can map to different image sub-pixels (not shown) in the first mosaic. Each sub-pixel can map to one photodiode.

PS 400 can convert a mosaic (e.g., a first mosaic) into a full-color image via demosaicing. Demosaicing can include full-color interpolation. Full-color interpolation can include assigning multiple color channels (e.g., two, three, four, five, etc.) to each image pixel. For example, if PS 400 observes RGB color space, each image pixel can be assigned a red color channel, a green color channel, and a blue color channel during full-color interpolation.

In some embodiments, demosaicing can include remosaicing. For example, PS 400 can remosaic the first mosaic into a second mosaic, then perform full-color interpolation on the second mosaic. Remosaicing can include binning. For example, each image pixel in the first mosaic can have multiple color values (e.g., one per photodiode spatially mapping to the image pixel) for the same color channel. During binning, the color channels for each image pixel can be combined (e.g., averaged).

Any stage of an image can be in a transient state, where the image exists as signals in PS 400 or a stable state, when the image is preserved in memory (e.g., volatile memory and/or non-volatile memory). Whether in transient form or stable form, an image can have a resolution, which quantifies the detail that the image holds. The smallest unit of resolution can be an image pixel.

Stable image and transient images can have image pixels stored in compressed form. For example, a JPEG image is a full-color image. The three color channels of each image pixel in a JPEG image are stored in a compressed format (e.g., in the frequency domain). Upon accessing a JPEG image, PS 400 can use a codec to unpack the three color channels of each image pixel.

Block 1604 can include demosaicing and thus result in a full-color image. Demosaicing is discussed above. PS 400 can decline to prepare (e.g., produce, create) a full-color image until AEC is complete.

At block 1606, PS 400 can determine (e.g., estimate) scene dynamic range. Estimating scene dynamic range can include using slow photodiodes 806 to find a ceiling of the scene dynamic range and fast photodiodes 807 to find a floor of the scene dynamic range. Block 1606 can include blocks 1606*a-c*. During block 1606, PS 400 can build one or more of histograms 1710, 1720, 1730, 1740 (discussed below).

At block 1606*a*, PS 400 can normalize the first photometrics with respect to the fast photodiodes 807. As addressed above, the slow photodiodes 806 can have a different configuration than the fast photodiodes 807 to result in different saturation times. Therefore, the first photometrics can lie on a first scale corresponding to the slow photodiodes 806 and the second photometrics can lie on a second scale corresponding to the fast photodiodes 807. The first and second scales can be different.

PS 400 can normalize (e.g., scale, compensate) the first photometrics with respect to the fast photodiodes 807 to put the first photometrics on the same scale as the second photometrics. Therefore, in some embodiments, the second photometrics are not normalized. For example, a first photometric of X can indicate the same scene intensity (e.g., brightness) as a second photometric of 2*X. Therefore, PS 400 can normalize the first photometrics by increasing (e.g., upscaling) the first photometrics. According to the above example, PS 400 could multiply each first photometric by two. PS 400 can normalize based on a difference between (e.g., ratio between) light receptive area 805*a* of the slow photodiodes 806 and light receptive area 805*a* of the fast photodiodes 807.

At block 1606*b*, PS 400 can find (e.g., determine, estimate) a scene dynamic range ceiling. At block 1606*b*, PS 400 can attempt to construct scene dynamic range top end 1713 of histogram 1710 (discussed below).

PS 400 can determine whether a sufficient number (e.g., a sufficient percentage) of normalized (e.g., scaled, compensated) first photometrics lie above a saturation photometric of the fast photodiodes. The saturation photometric can be a fixed and/or predetermined photocharge. PS 400 can make this determination by building histograms 1720 and 1730.

If an insufficient number of first photometrics lie above the saturation photometric (of the fast photodiodes 807), then PS 400 can assess that no oversaturation clipping of the second photometrics has occurred. If a sufficient number of normalized first photometrics lie above the saturation photometric, then PS 400 can assess that oversaturation clipping of the second photometrics has occurred.

At block 1606*c*, PS 400 can find (e.g., estimate) a scene dynamic range floor. At block 1606*c*, PS 400 can attempt to construct scene dynamic range bottom end 1711 of histogram 1710 (discussed below). PS 400 can use the second photometrics, but not the first photometrics to find the dynamic range floor (PS 400 can similarly exclude the third photometrics, discussed below, finding scene dynamic range ceiling during block 1606*b*).

At block 1608, PS 400 can generate (e.g., determine, calculate) one or more metrics based on the outcomes of block 1606. PS 400 can determine whether to perform automatic exposure control (AEC) based on the one or more metrics. During block 1608, PS 400 can produce one or more histograms, as discussed below with reference to FIG. 17. Block 1608 can include blocks 1608*a*-1608*d*.

PS 400 can perform block 1608*a* in response to finding oversaturation clipping at block 1606*b* and/or undersaturation clipping at block 1606*c*. PS 400 can perform block 1606 (e.g., blocks 1606*a*-1606*c*) during block 1608*a*.

At block 1608*a*, PS 400 can quantify the number of oversaturated fast photodiodes 807 and the number of undersaturated fast photodiodes 807. PS 400 can do so by analyzing histogram 1720 in light of histograms 1710 and/or 1730. Therefore, PS 400 can use the histograms discussed with reference to FIG. 17 to quantify oversaturated and/or undersaturated photodiodes 805.

Given the normalized first photometrics, PS 400 can estimate how many fast photodiodes 807 should be fully saturated. PS 400 can assume that the remaining fast photodiodes 807 producing a maximum photometric are oversaturated. PS 400 can perform the reverse operation to estimate how many fast photodiodes 807 are undersaturated based on the normalized third photometrics.

At block 1608*b*, PS 400 can quantify a magnitude of oversaturation and a magnitude of undersaturation. PS 400 can individually quantify (e.g., estimate) the magnitude of each oversaturation and the magnitude of each undersaturation. Alternatively or in addition, PS 400 can find a median or average of the normalized first photometrics exceeding the oversaturation threshold of the fast photodiodes 807. PS 400 can compare the median or average with the saturation capacity (i.e., the oversaturation threshold) of the fast photodiodes 807.

For example, if the oversaturation threshold is 50 photocharge units and the normalized first photometrics includes 48 photocharge units, 52 photocharge units, and 54 photocharge units, PS 400 can compare the median or average of 53 photocharge units (48 photocharge units can be ignored for being under the oversaturation threshold) with the oversaturation threshold of 50 photocharge units. PS 400 can perform the reverse with respect to the undersaturation threshold of the fast photodiodes 807 (which can be zero or one).

At block 1608*c*, PS 400 can perform statistical measurements on the spread of second photometrics to determine whether the second photometrics are clustered or spread out. PS 400 can assign a dispersal rating to the second photometrics based on the statistical measurements. Dispersal can be judged by analyzing whether histogram 1720 includes clusters of photometrics.

At block 1608*d*, PS 400 can determine whether to execute AEC based on one or more factors. Factor one can be the number of oversaturated fast photodiodes 807. Factor two can be the magnitude of oversaturation for the oversaturated fast photodiodes 807 (as approximated with the comparison between the median or average of the first photometrics with the oversaturation capacity of the fast photodiodes 807). Factor three can be the number of undersaturated fast photodiodes 807. Factor four can the magnitude of undersaturation for the undersaturated fast photodiodes 807 (as approximated with the comparison between the median or average of the third photometrics with the undersaturation threshold/capacity of the fast photodiodes 807). Factor five can be the dispersal rating. A high dispersal (i.e., photometrics being spread out) can weigh against an AEC adjustment and a low dispersal (i.e., second photometrics being clustered together) can weigh in favor of an AEC adjustment. An example of a dispersal rating can be based on a standard deviation of photometric density. For example, if the standard deviation is high, then dispersal can be low and if the standard deviation is low, then the dispersal can be high.

If PS 400 determines that AEC is unnecessary at block 1608d, then PS 400 can return to block 1602. If PS 400 determines that AEC is necessary at block 1608d, then PS 400 can proceed to block 1610. At block 1610, PS 400 can execute AEC. Techniques for performing AEC are discussed above and can include adjusting photodiode 805 integration time, photodiode 805 gain, and/or aperture size.

As discussed, PS 400 can reduce integration time to reduce exposure. PS 400 can increase integration time to increase exposure. The magnitude of AEC can be based on any of the metrics of block 1608. For example, integration time can be reduced based on (e.g., at least based on) the number of oversaturated fast photodiodes 807 and the median/average oversaturation magnitude thereof.

Figure 18:
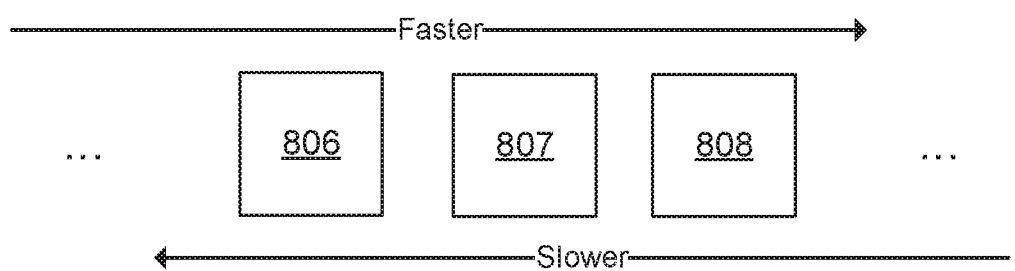
FIG. 18 is a block diagram showing relationships between photodiodes.

As shown schematically in FIG. 18, sensor pixels 501 can each include at least three photodiodes 805 with different saturation times, e.g., first slow photodiodes 806, second fast photodiodes 807, and third fastest photodiodes 808 According to these embodiments, PS 400 can use third photometrics from the fastest photodiodes 805 to find scene dynamic range floor.

The terms slow, fast, and fastest are relative. The second fast photodiodes 807 can be slower than the third fastest photodiodes 808. Put differently, the second fast photodiodes 807 can be thought of as intermediate-speed. The term fastest is also relative and conveys that the third photodiodes 808 are faster than both the first 806 and second 807 photodiodes. The term fastest is not intended to convey that the third photodiodes 808 are the fastest photodiodes 805 in all of sensor panel 121 (although third photodiodes 808 can be in some embodiments).

Therefore at block 1606a, PS 400 can normalize the third photometrics from the fastest photodiodes 808 to the fast photodiodes 807 (e.g., by downscaling the third photometrics). And at block 1606c, PS 400 can perform the opposite of block 1606b where PS 400 uses the normalized third photometrics to assess whether undersaturation clipping of the second photometrics has occurred.

If an insufficient number of normalized third photometrics lie below a undersaturation photometric (the undersaturation photometric can correspond to the minimum amount of photocharge necessary to activate the fast photodiodes 807) of the fast photodiodes 807, then PS 400 can assess that undersaturation clipping of the second photometrics has not occurred. If a sufficient number of normalized third photometrics lie below a undersaturation photometric of the fast photodiodes, then PS 400 can assess that undersaturation clipping of the second photometrics has occurred.

As with all features disclosed herein, the third photometrics are optional. Various embodiments can lack fastest photodiodes and thus the ability to produce third photometrics.

Figure 17:
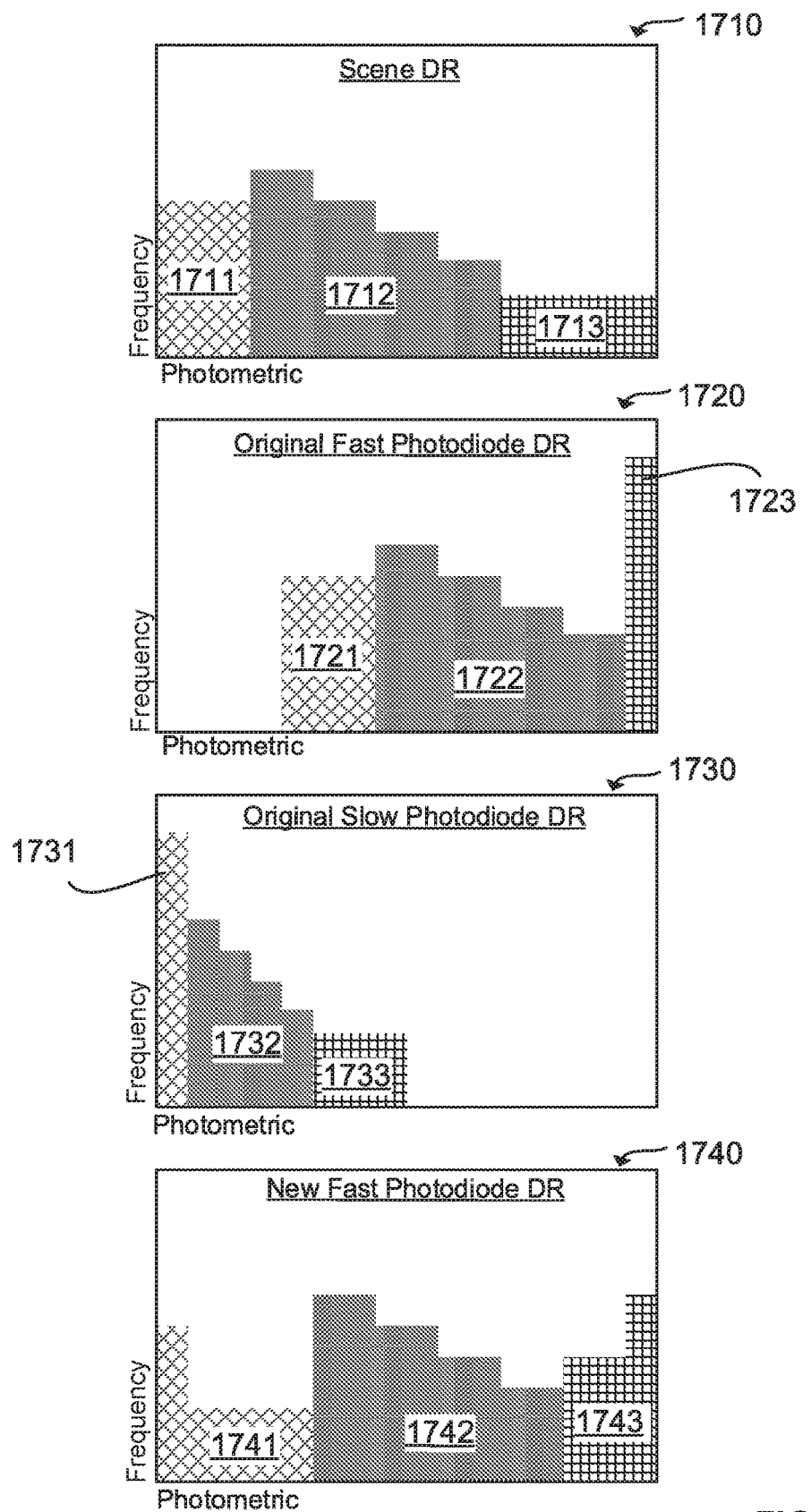
FIG. 17 shows histograms of an example use case consistent with the methods of FIGS. 15 and 16

FIG. 17 illustrates an example application of the methods of FIGS. 15 and 16 through histograms including a scene dynamic range (DR) histogram 1710, an original fast photodiode DR histogram 1720, an original slow photodiode DR histogram 1730, and a new fast photodiode histogram 1740. Each histogram can have a different X-axis scale.

Photometric value (e.g., magnitude) increases along each X axis. Therefore undersaturated (e.g., zero) photometrics are on the left side histogram and oversaturated (e.g., maximum capacity) photometrics are on the right side. Photometric frequency runs along each Y axis. Therefore, rare photometric magnitudes are short (or nonexistent) while abundant (e.g., frequent) photometric magnitudes are tall.

Referring to histogram 1710, the scene dynamic range includes a low brightness (e.g., intensity) portion 1711 corresponding to the bottom of the scene dynamic range, a medium brightness portion 1712 corresponding to the middle of the scene dynamic range, and a high brightness portion 1713 corresponding to a top of the scene dynamic range. Histograms 1720, 1730, and 1740 follow the same hatching conventions as scene DR histogram 1710.

Scene DR histogram 1710 can represent the true scene dynamic range and/or an approximate of the scene dynamic range. PS 400 can create scene DR histogram 1710 by building original fast photodiode histogram 1720 and one or both of original slow photodiode histogram 1730 and an original fastest photodiode histogram (not shown).

Referring to original fast photodiode histogram 1720, camera 101 has fully captured the low end of the scene dynamic range with low magnitude second photometrics 1721 and fully captured the middle of the scene dynamic range with intermediate magnitude second photometrics 1722. Original fast photodiode histogram 1720 includes a large quantity of fully saturated (i.e., maximum) magnitude photometrics 1723. As indicated by the matching hatch patterns, fully saturated photometrics 1723 correspond to scene dynamic range top 1713.

As shown in scene DR histogram 1710, scene dynamic range top can include many different light intensities and thus result in multiple different second photometrics. However, due to oversaturation, camera 101 has assigned the same maximum intensity to the entire scene dynamic range top 1713. Fast photodiodes 807 have therefore clipped at least a portion of scene dynamic range top 1713.

PS 400 can infer that oversaturation clipping has occurred based on the unusual number (e.g., more than a predetermined number) of photometrics with the same maximum value. However, PS 400 may not have complete confidence based on the original fast photodiode DR histogram 1720 alone because some or all of fully saturated photometrics 1723 can be correct (i.e., not clipped). Furthermore, PS 400 may be unable to determine the magnitude of clipping based on original fast photodiode DR histogram 1720 alone.

Original slow photodiode DR histogram 1730 has fully captured scene dynamic range middle 1712 with intermediate first photometrics 1732 and scene dynamic range top 1713 with high first photometrics 1733. Histogram 1730 includes an unusual number (e.g., less than a predetermined number) of low (e.g., zero) magnitude readings 1731 corresponding to scene dynamic range bottom 1711. Therefore, the slow photodiodes 806 have undersaturation clipped 1731x scene dynamic range bottom 1711.

During the methods of FIGS. 15 and/or 16, PS 400 can normalize (e.g., scale) original slow photodiode histogram 1730 and original fastest photodiode histogram to original fast photodiode histogram 1720 (e.g., block 1606a, which can occur during block 1608a). If the normalized values exceed the ceiling of the second photometrics, then PS 400 can judge that oversaturation clipping has occurred (e.g., block 1606b, which can occur during block 1608a). If the normalized values fall below the floor of the second photometrics, then PS 400 can judge that undersaturation clipping has occurred (e.g., block 1606c, which can occur during block 1608a).

PS 400 can estimate (e.g., determine) how many instances of second photometric oversaturation clipping occurred, and slide those instances along the X axis of original fast photodiode histogram 1720 past the ceiling of histogram 1720 (e.g., block 1608b). To do so, PS 400 can estimate a true X axis value for each of the ceiling (e.g., maximum) second photometrics by interpolating normalized first photometrics produced by neighboring slow photodiodes 806. If the true X axis value of a particular second photometric is greater than its current value, PS 400 can slide the second photometric to the true X axis coordinate. PS 400 can then supplement the histogram 1720 with each of the normalized first photometrics.

Similarly, PS 400 can estimate (e.g., determine) how many instances of second photometric undersaturation clipping occurred, and slide those instances along the X axis of original fast photodiode histogram 1720 past the floor of histogram 1720 (e.g., block 1608b). To do so, PS 400 can estimate a true X axis value for each of the floor (e.g., minimum) second photometrics by interpolating normalized first photometrics produced by neighboring slow photodiodes 806. If the true X axis value of a particular second photometric is greater than its current value, PS 400 can slide the second photometric to the true X axis coordinate. PS 400 can then supplement the histogram 1720 with each of the normalized third photometrics.

After approximating the complete (e.g., expanded) scene DR (e.g., building histogram 1710), PS 400 can perform block 1608d based on histogram 1710. Put differently, PS 400 can determine whether to execute AEC, in what direction, and to what extent, based on histogram 1710. PS 400 can execute AEC to minimize clipping of the scene dynamic range.

In some embodiments, clipping can be minimized by minimizing (i.e., reducing) the aggregate number of clipping instances. In other embodiments, clipping can be minimized by minimizing (i.e., reducing) a clipping index. PS 400 can assign a weight or magnitude to each instance of second photometric clipping based on a difference between the true X axis value of the second photometric and the captured value. PS 400 can sum a magnitude of each weighted clipping instance to build a clipping index. PS 400 can then perform AEC to reduce the clipping index.

Before creating new fast photodiode DR histogram 1740, PS 400 performed AEC by reducing integration time of sensor pixels 501. As shown in new fast photodiode DR histogram 1740, the fast photodiodes 807 better captured the entire scene dynamic range (i.e., AEC has minimized clipping). Because the scene dynamic range was wide, camera 101 was unable to simultaneously prevent oversaturation clipping and undersaturation clipping. Therefore, a small portion of the scene dynamic range bottom was clipped (as evidenced by the large number of minimum or undersaturated photometrics at the left of histogram 1740). And a small portion of the scene dynamic range top was clipped (as evidenced by the large number of maximum or saturated photometrics at the right of histogram 1740).

Referring to FIG. 1, mobile device 100 can be a smartphone 100a, a tablet, a digital camera, or a laptop. Mobile device 100 can be a dedicated camera assembly 100b. Mobile device 100 can be mounted to a larger structure (e.g., a vehicle or a house). Mobile device 100 (or any other device, such as a vehicle or desktop computer) can include processing system 400.

As schematically shown in FIG. 4, mobile device 100 (or any other device, such as a vehicle or desktop computer) can include a PS 400. PS 400 can include one or more processors 401, memory 402, one or more input/output devices 403, one or more sensors 404, one or more user interfaces 405, one or more motors/actuators 406, and one or more data buses 407.

Processors 401 can include one or more distinct processors, each having one or more cores. Each of the distinct processors can have the same or different structure. Processors 401 can include one or more central processing units (CPUs), one or more graphics processing units (GPUs), circuitry (e.g., application specific integrated circuits (ASICs)), digital signal processors (DSPs), and the like. Processors 401 can be mounted on a common substrate or to different substrates. Processors 401 can include read-out circuitry of sensor panel 121. Processors 401 can include circuitry defining an image processing pipeline.

Processors 401 are configured to perform a certain function, method, or operation at least when one of the one or more of the distinct processors is capable of executing code, stored on memory 402 embodying the function, method, or operation. Processors 401 can be configured to perform any and all functions, methods, and operations disclosed herein.

For example, when the present disclosure states that PS 400 can perform task "X", such a statement should be understood to disclose that PS 400 can be configured to perform task "X". Mobile device 100 and PS 400 are configured to perform a function, method, or operation at least when processors 401 are configured to do the same.

Memory 402 can include volatile memory, non-volatile memory, and any other medium capable of storing data. Each of the volatile memory, non-volatile memory, and any other type of memory can include multiple different memory devices, located at multiple distinct locations and each having a different structure.

Examples of memory 402 include a non-transitory computer-readable media such as RAM, ROM, flash memory, EEPROM, any kind of optical storage disk such as a DVD, a Blu-Ray® disc, magnetic storage, holographic storage, an HDD, an SSD, any medium that can be used to store program code in the form of instructions or data structures, and the like. Any and all of the methods, functions, and operations described in the present application can be fully embodied in the form of tangible and/or non-transitory machine-readable code saved in memory 402.

Input-output devices 403 can include any component for trafficking data such as ports and telematics. Input-output devices 403 can enable wired communication via Universal Serial Bus (USB®), DisplayPort®, High-Definition Multimedia Interface (HDMI®), Ethernet, and the like. Input-output devices 403 can enable electronic, optical, magnetic, and holographic, communication with suitable memory 403. Input-output devices can enable wireless communication via any wireless standard (e.g., a wireless local area network, a cellular connection, a near-field communication, and so on).

Sensors 404 can capture physical measurements of environment and report the same to processors 401. Sensors 404 can include photodiodes 805.

User interface 405 can enable user interaction with imaging system 40. User interface 405 can include displays (e.g., LED touchscreens (e.g., OLED touchscreens), physical buttons, speakers, microphones, keyboards, and the like. User interface 405 can include display 42 and hard button 43.

Motors/actuators 406 can enable processor 401 to control mechanical forces. If camera 101 includes auto-focus, motors/actuators 406 can move a lens along its optical axis to provide auto-focus and/or perform optical image stabilization.

Data bus 407 can traffic data between the components of PS 400. Data bus 407 can include conductive paths printed on, or otherwise applied to, a substrate (e.g., conductive paths on a logic board), Serial AT Attachment (SATA) cables, coaxial cables, USB® cables, Ethernet cables, copper wires, and the like. According to some embodiments, data bus 407 can include one or more wireless communication pathways and thus PS 400 can be distributed across a network such as the internet. Data bus 407 can include a series of different wires 407 (e.g., USB® cables) through which different components of PS 400 are connected.

I claim:

1. A method, comprising:
    capturing a scene by integrating a first sensor pixel for a first amount of time to produce an original first photometric and integrating a second sensor pixel for the first amount of time to produce an original second photometric, the first sensor pixel being configured to saturate with photocharge slower than the second sensor pixel;
    normalizing the original first photometric with respect to the second sensor pixel; and
    re-capturing the scene by integrating the second sensor pixel for a second amount of time to produce a newer second photometric, the second amount of time being based on the normalized original first photometric, and the second amount of time being less than the first amount of time.

2. The method of claim 1, further comprising:
    prior to re-capturing the scene, determining whether the original second photometric has been clipped based on the normalized original first photometric.

3. The method of claim 2, wherein determining whether the original second photometric has been clipped based on the normalized original first photometric comprises
    determining whether the normalized original first photometric would oversaturate the second sensor pixel.

4. The method of claim 3, further comprising:
    comparing the normalized original first photometric and a saturation capacity of the second sensor pixel; and
    setting the second amount of time based on the comparison.

5. The method of claim 1, wherein the first sensor pixel and the second sensor pixel are configured to have equal photocharge capacity, the first sensor pixel comprises shielding, and the first sensor pixel is configured to more slowly saturate with photocharge than the second sensor pixel by virtue of the shielding.

6. The method of claim 5, wherein the shielding is applied directly over a photodiode of the first sensor pixel.

7. The method of claim 6, wherein the first sensor pixel comprises a plurality of photodiodes and the method further comprises:
    performing phase detection autofocus based on the first sensor pixel.

8. The method of claim 1, further comprising:
    prior to re-capturing the scene, determining whether the original second photometric is greater than or equal to a maximum photocharge capacity of the second sensor pixel;
    based on an affirmative determination, determining whether the original second photometric has been clipped based on the original first photometric.

9. A method comprising:
    capturing a scene with a scene dynamic range by integrating a plurality of first sensor pixels for a first amount of time to produce a plurality of original first photometrics and integrating a plurality of second sensor pixels for the first amount of time to produce a plurality of original second photometrics, each of the plurality of first sensor pixels being configured to saturate with photocharge slower than each of the plurality of second sensor pixels;
    normalizing the plurality of original first photometrics with respect to the plurality of second sensor pixels;
    determining whether at least some of the plurality of second sensor pixels clipped a top end of the scene dynamic range based on the normalized plurality of original first photometrics; and
    based on determining that at least some of the plurality of second sensor pixels clipped the top end of the scene dynamic range, re-capturing the scene by integrating the plurality of second sensor pixels for a second amount of time to produce a plurality of newer second photometrics, the second amount of time being less than the first amount of time.

10. The method of claim 9, comprising setting the second amount of time based on the first amount of time, the plurality of original first photometrics, and the plurality of original second photometrics.

11. A processing system comprising one or more processors configured to:
    capture a scene by integrating a first sensor pixel for a first amount of time to produce an original first photometric and by integrating a second sensor pixel for the first amount of time to produce an original second photometric, the first sensor pixel being configured to saturate with photocharge slower than the second sensor pixel;
    normalize the original first photometric with respect to the second sensor pixel; and
    re-capture the scene by integrating the second sensor pixel for a second amount of time to produce a newer second photometric, the second amount of time being based on the normalized original first photometric, and the second amount of time being less than the first amount of time.

12. The system of claim 11, wherein the one or more processors are configured to: determine whether the original second photometric has been clipped based on the normalized original first photometric prior to recapturing the scene.

13. The system of claim 12, wherein the one or more processors are configured to:
    determine whether the original second photometric has been clipped based on the original first photometric by determining whether the normalized original first photometric would oversaturate the second sensor pixel.

14. The system of claim 13, wherein the one or more processors are configured to:

compare the normalized original first photometric and a saturation capacity of the second sensor pixel; and set the second amount of time based on the comparison.

15. The system of claim 11, wherein the first sensor pixel and the second sensor pixel are configured to have equal photocharge capacity and the first sensor pixel is configured to more slowly saturate with photocharge than the second sensor pixel by virtue of shielding applied in the first sensor pixel.

16. The system of claim 15, wherein the shielding is applied directly over a portion of a photodiode of the first sensor pixel.

17. The system of claim 16, wherein the first sensor pixel comprises a plurality of photodiodes and the one or more processors are configured to:

perform phase detection autofocus based on the first sensor pixel.

18. The system of claim 11, wherein the one or more processors are configured to:

prior to re-capturing the scene, determine whether the original second photometric is greater than or equal to a maximum photocharge capacity of the second sensor pixel;

based on an affirmative determination, determine whether the original second photometric has been clipped based on the original first photometric.

19. The system of claim 11, wherein the one or more processors are configured to compute the second amount of time based on a difference between the original first photometric, after being scaled, and a dynamic range ceiling.

20. The system of claim 11, wherein the one or more processors are configured to compute the second amount of time based on the original first photometric after being normalized to a scale of the original second photometric, the first sensor pixel having a different structure than the second sensor pixel, the first sensor pixel and the second sensor pixel both having the same kind of color filter.

* * * * *